（12）United States Patent
Kim et al.

(10) Patent No.: US 12,032,765 B2
(45) Date of Patent: *Jul. 9, 2024

(54) DISPLAY APPARATUS WITH INTEGRATED TOUCH SCREEN

(71) Applicant: LG Display Co., Ltd., Seoul (KR)

(72) Inventors: Tae-Kyung Kim, Paju-si (KR); Wonyeol Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,682

(22) Filed: Apr. 24, 2023

(65) Prior Publication Data

US 2023/0259224 A1 Aug. 17, 2023

Related U.S. Application Data

(63) Continuation of application No. 17/883,448, filed on Aug. 8, 2022, now Pat. No. 11,669,186, which is a
(Continued)

(30) Foreign Application Priority Data

Dec. 11, 2017 (KR) .......................... 10-2017-0169759

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0416* (2013.01); *G06F 3/04164* (2019.05);
(Continued)

(58) Field of Classification Search
CPC .... G06F 3/0412; G06F 3/0446; G06F 3/0443; G06F 3/0416; G06F 3/044; G06F 2203/04111; G06F 2300/0452
See application file for complete search history.

(56) References Cited

U.S. PATENT DOCUMENTS 9,367,162 B2 6/2016 Lee
9,442,284 B2 9/2016 Kim et al.
(Continued)

FOREIGN PATENT DOCUMENTS

KR 10-2013-0143300 A 12/2013
KR 10-2014-0069708 A 6/2014
(Continued)

OTHER PUBLICATIONS

Office Action from the Korean Intellectual Property Office dated Dec. 17, 2021, in corresponding Korean Patent Application No. 10-2017-0169759.
(Continued)

*Primary Examiner* — Lixi C Simpson
(74) *Attorney, Agent, or Firm* — Morgan, Lewis & Bockius LLP

(57) ABSTRACT

A display apparatus with an integrated touch screen is provided. The display apparatus includes: a light-emitting device layer on a first substrate, a first encapsulation layer on the light-emitting device layer, a touch sensing layer on the light-emitting device layer, and a second encapsulation layer on the touch sensing layer, the second encapsulation layer including at least one inorganic layer.

15 Claims, 13 Drawing Sheets

Related U.S. Application Data continuation of application No. 17/399,992, filed on Aug. 11, 2021, now Pat. No. 11,467,686, which is a continuation of application No. 16/216,164, filed on Dec. 11, 2018, now Pat. No. 11,106,297.

(51) Int. Cl.

| | | |
|---|---|---|
| *G09G 3/3266* | (2016.01) | |
| *G09G 3/3291* | (2016.01) | |
| *H01L 27/32* | (2006.01) | |
| *H01L 51/52* | (2006.01) | |
| *H10K 50/11* | (2023.01) | |
| *H10K 50/842* | (2023.01) | |
| *H10K 50/844* | (2023.01) | |
| *H10K 50/86* | (2023.01) | |
| *H10K 59/12* | (2023.01) | |
| *H10K 59/35* | (2023.01) | |
| *H10K 59/38* | (2023.01) | |
| *H10K 59/40* | (2023.01) | |
| *H10K 59/122* | (2023.01) | |
| *H10K 59/131* | (2023.01) | |

(52) U.S. Cl.
CPC ............ *G06F 3/044* (2013.01); *G06F 3/0443* (2019.05); *G06F 3/0446* (2019.05); *G09G 3/3266* (2013.01); *G09G 3/3291* (2013.01); *H10K 50/11* (2023.02); *H10K 50/8426* (2023.02); *H10K 50/844* (2023.02); *H10K 50/8445* (2023.02); *H10K 50/865* (2023.02); *H10K 59/12* (2023.02); *H10K 59/35* (2023.02); *H10K 59/38* (2023.02); *H10K 59/40* (2023.02); *G06F 3/0445* (2019.05); *G06F 2203/04102* (2013.01); *G06F 2203/04111* (2013.01); *G06F 2203/04112* (2013.01); *G09G 2300/0452* (2013.01); *G09G 2310/08* (2013.01); *H10K 59/122* (2023.02); *H10K 59/131* (2023.02); *H10K 59/352* (2023.02); *H10K 59/353* (2023.02)

(56) References Cited

U.S. PATENT DOCUMENTS

| | | |
|---|---|---|
| 9,947,727 B2 | 4/2018 | Lee et al. |
| 9,991,465 B2 | 6/2018 | Jeon |
| 10,241,602 B2 | 5/2019 | Huo |
| 11,106,297 B2 | 8/2021 | Kim et al. |
| 11,467,686 B2 | 10/2022 | Kim et al. |
| 11,669,186 B2* | 6/2023 | Kim ...................... G06F 3/0446 |
| | | 345/173 |
| 2014/0145979 A1 | 5/2014 | Lee |
| 2015/0153779 A1 | 6/2015 | Ko et al. |
| 2016/0283005 A1 | 9/2016 | Lee |
| 2016/0307971 A1* | 10/2016 | Jeon ...................... G09G 3/3233 |
| 2016/0315284 A1 | 10/2016 | Jeon |
| 2016/0336541 A1 | 11/2016 | Kim |
| 2016/0349499 A1 | 12/2016 | Kim et al. |
| 2017/0184897 A1 | 6/2017 | Rho |
| 2017/0262109 A1 | 9/2017 | Choi et al. |
| 2018/0013095 A1 | 1/2018 | Choi et al. |
| 2018/0033830 A1* | 2/2018 | Kim ...................... H10K 59/122 |
| 2018/0204886 A1 | 7/2018 | Lee et al. |
| 2018/0308903 A1* | 10/2018 | Jeong ................... G06F 3/0446 |
| 2019/0050078 A1 | 2/2019 | Hamada et al. |
| 2019/0155418 A1 | 5/2019 | Zheng et al. |

FOREIGN PATENT DOCUMENTS

| | | |
|---|---|---|
| KR | 10-2016-0127873 A | 11/2016 |
| KR | 10-2017-0029162 A | 3/2017 |
| KR | 10-2017-0077656 A | 7/2017 |
| KR | 10-2017-0079506 A | 7/2017 |
| KR | 10-2017-0080071 A | 7/2017 |
| KR | 10-2017-0106621 A | 9/2017 |

OTHER PUBLICATIONS

Office Action issued by the Korean Patent Office dated Nov. 2, 2022, in related Korean Patent Application No. 10-2022-0098677.

* cited by examiner

DISPLAY APPARATUS WITH INTEGRATED TOUCH SCREEN

CROSS-REFERENCE TO RELATED APPLICATION(S)

This application is a continuation of co-pending U.S. patent application Ser. No. 17/883,448, filed on Aug. 8, 2022, which is a continuation of U.S. patent application Ser. No. 17/399,992, filed on Aug. 11, 2021, now U.S. Pat. No. 11,467,686, which is a continuation of U.S. patent application Ser. No. 16/216,164, filed on Dec. 11, 2018, now U.S. Pat. No. 11,106,297, which claims the benefit of and priority to Korean Patent Application No. 10-2017-0169759, filed on Dec. 11, 2017. The foregoing prior U.S. and Korean patent applications are hereby incorporated by reference in their entirety as if fully set forth herein.

BACKGROUND

1. Technical Field

The present disclosure relates to a display apparatus with an integrated touch screen.

2. Discussion of the Related Art

With the advancement of an information-oriented society, various requirements for display apparatuses for displaying an image are increasing. Therefore, various display apparatuses, such as liquid crystal display (LCD) apparatuses, plasma display panels (PDPs), and organic light-emitting display apparatuses have recently been used. In such display apparatuses, the organic light-emitting display apparatuses are driven with a low voltage, and have characteristics such as thinness, an excellent viewing angle, a fast response time, etc.

The organic light-emitting display apparatuses each include a display panel, which includes a plurality of data lines, a plurality of scan lines, and a plurality of pixels respectively provided in a plurality of pixel areas defined by intersections of the data lines and the scan lines, a scan driver that supplies respective scan signals to the scan lines, and a data driver that supplies respective data voltages to the data lines. Each of the pixels includes an organic light-emitting device, a driving transistor that controls the amount of current supplied to the organic light-emitting device according to a voltage of a gate electrode, and a scan transistor that supplies a data voltage of a corresponding data line to the gate electrode of the driving transistor in response to a scan signal of a corresponding scan line.

Recently, the organic light-emitting display apparatuses are implemented as a display apparatus with an integrated touch screen including a touch screen panel capable of sensing a touch of a user. In this case, the organic light-emitting display apparatuses function as a touch screen device. Recently, a touch screen device is applied to monitors, such as navigation systems, industrial terminals, notebook computers, financial automation equipment, and game machines; portable terminals, such as portable phones, MP3 players, personal digital assistants (PDAs), PMPs, PSPs, portable game machines, DMB receivers, and tablet personal computers (PCs); and home appliances, such as refrigerators, microwave ovens, and washing machines. Because all users can easily manipulate the touch screen device, the application of the touch screen device is being progressively expanded.

In display apparatuses with an integrated touch screen, first touch electrodes, second touch electrodes, and bridge electrodes for connecting the first touch electrodes or the second touch electrodes are provided in a display panel. The first touch electrodes may be transmission (Tx) electrodes, and the second touch electrodes may be reception (Rx) electrodes.

Moreover, an organic layer may be provided on the first touch electrodes, the second touch electrodes, and the bridge electrodes. The organic layer is vulnerable to water. Water flowing into the organic layer penetrates into the first touch electrodes, the second touch electrodes, and the bridge electrodes. Therefore, the first touch electrodes, the second touch electrodes, and the bridge electrodes are oxidized, and due to this, a touch is not normally performed.

Moreover, the organic layer that are provided on the first touch electrodes, the second touch electrodes, and the bridge electrodes may be attached on an upper substrate by an adhesive layer. In the organic layer, particles occur in an upper portion of the organic layer in a manufacturing process, and air bubbles occur due to outgassing. For this reason, an adhesive force between the organic layer and the adhesive layer is reduced, and interface de-bonding occur in a high temperature and humidity environment.

SUMMARY

Accordingly, embodiments of the present disclosure are directed to a display apparatus with an integrated touch screen that substantially obviates one or more of the issues due to limitations and disadvantages of the related art.

An aspect of the present disclosure is to provide a display apparatus with an integrated touch screen, which prevents water from penetrating into touch electrodes.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus with an integrated touch screen, the display apparatus including: a light-emitting device layer on a first substrate, a first encapsulation layer on the light-emitting device layer, a touch sensing layer on the light-emitting device layer, and a second encapsulation layer on the touch sensing layer, the second encapsulation layer including at least one inorganic layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Figure 1:
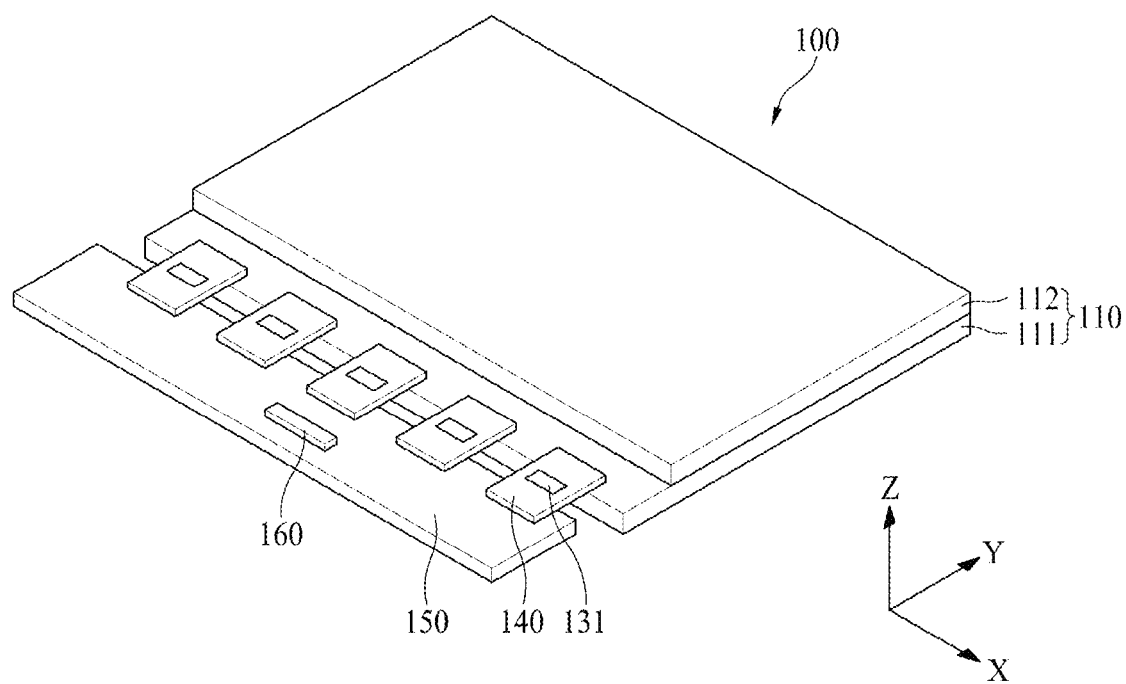
FIG. 1 is a perspective view illustrating a display apparatus with an integrated touch screen according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

An x-axis direction, a y-axis direction, and a z-axis direction should not be construed as only a geometric relationship in which a relationship therebetween is vertical, and may denote having a broader directionality within a scope where elements of the present disclosure operate functionally.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, example embodiments of the present disclosure will be described in detail with reference to the accompanying drawings.

Figure 2:
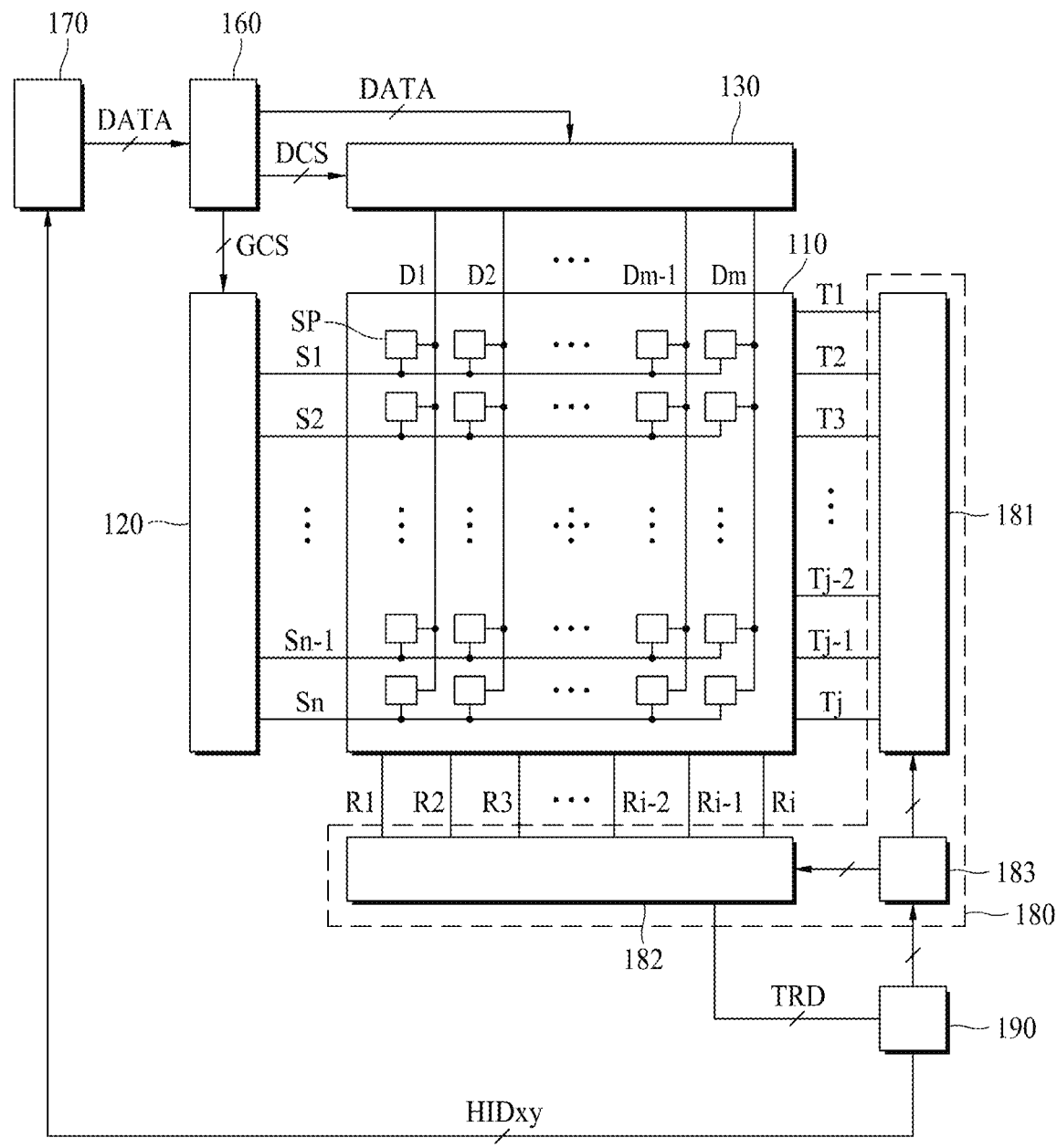
FIG. 2 is a block diagram illustrating a display apparatus with an integrated touch screen according to an embodiment of the present disclosure.

FIG. 1 is a perspective view illustrating a display apparatus with an integrated touch screen according to an embodiment of the present disclosure. FIG. 2 is a block diagram illustrating a display apparatus with an integrated touch screen according to an embodiment of the present disclosure.

With reference to FIGS. 1 and 2, a display apparatus 100 with an integrated touch screen according to an embodiment of the present disclosure may include a display panel 110, a scan driver 120, a data driver 130, a timing controller 160, a host system 170, a touch driver 180, and a touch coordinate calculator 190. The display apparatus with an integrated touch screen according to an embodiment of the present disclosure may be implemented with an LCD apparatus, a field emission display (FED) apparatus, a PDP device, an organic light-emitting display apparatus, an electrophoresis display (EPD) apparatus, or the like. Hereinafter, an example in which the display apparatus with an integrated touch screen according to an embodiment of the present disclosure is implemented with an organic light-emitting display apparatus will be described, but embodiments of the present disclosure are not limited thereto.

The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film (a protective film), or the like.

The display panel 110 may include a display area in which a plurality of subpixels SP may be provided to display an image. A plurality of data lines D1 to Dm (where "m" is a positive integer greater than or equal to two) and a plurality of scan lines S1 to Sn (where "n" is a positive integer greater than or equal to two) may be provided. The data lines D1 to Dm may intersect the scan lines S1 to Sn. The subpixels SP may be respectively provided in a plurality of areas defined by an intersection structure of the data lines D1 to Dm and the scan lines S1 to Sn.

Each of the subpixels SP of the display panel 110 may be connected to one of the data lines D1 to Dm and one of the scan lines S1 to Sn. Each of the subpixels SP of the display panel 110 may include a driving transistor that may control a drain-source current according to a data voltage applied to a gate electrode, a scan transistor that may be turned on by a scan signal of a scan line, and that may supply the data voltage of a data line to the gate electrode of the driving transistor, an organic light-emitting diode (OLED) that may emit light with the drain-source current of the driving transistor, and a capacitor that store a voltage at the gate electrode of the driving transistor. Therefore, each of the subpixels SP may emit light with a current supplied to the OLED.

The scan driver 120 may receive a scan control signal GCS from the timing controller 160. The scan driver 120 may supply scan signals to the scan lines S1 to Sn according to the scan control signal GCS.

The scan driver 120 may be provided in a non-display area outside one side or both sides of a display area of the display panel 110 in a gate driver-in-panel (GIP) type. Alternatively, the scan driver 120 may be manufactured as a driving chip, and may be mounted on a flexible film, and moreover, may be attached on the non-display area outside the one side or the both sides of the display area of the display panel 110 in a tape automated bonding (TAB) type.

The data driver 130 may receive digital video data DATA and a data control signal DCS from the timing controller 160. The data driver 130 may convert the digital video data DATA into analog positive/negative data voltages according to the data control signal DATA, and may supply the data voltages to the data lines. For example, subpixels to which the data voltages are to be supplied may be selected by the scan signals of the scan driver 120, and the data voltages may be supplied to the selected subpixels.

The data driver 130, as shown in FIG. 1, may include a plurality of source drive integrated circuits (ICs) 131. Each of the plurality of source drive ICs 131 may be mounted on a flexible film 140 in a chip-on-film (COP) type or a chip-on-plastic (COP) type. The flexible film 140 may be attached on a plurality of pads provided in the non-display area of the display panel 110 by using an anisotropic conductive film. Thus, the plurality of source drive ICs 131 may be connected to the pads.

The flexible film 140 may be provided in plurality, and a circuit board 150 may be attached on the flexible films 140. A plurality of circuits respectively implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data DATA and timing signals from the host system 170. The timing signals may include a vertical synchronization signal, a horizontal synchronization signal, a data enable signal, a dot clock, etc. The vertical synchronization signal may be a signal that defines one frame period. The horizontal synchronization signal may be a signal that defines one horizontal period for supplying data voltages to subpixels of one horizontal line of the display panel 110. The data enable signal may be a signal that defines a period in which valid data may be input. The dot clock may be a signal that is repeated at a certain short period.

The timing controller 160 may generate the data control signal DCS for controlling an operation timing of the data driver 130 and the scan control signal GCS for controlling an operation timing of the scan driver 120 to control the operation timing of each of the scan driver 120 and the data driver 130, based on the timing signals. The timing controller 160 may output the scan control signal GCS to the scan driver 120, and may output the digital video data DATA and the data control signal DCS to the data driver 130.

The host system 170 may be implemented as a navigation system, a set-top box, a DVD player, a blue-ray player, a personal computer (PC), a home theater system, a broadcasting receiver, a phone system, or the like. The host system 170 may include a system-on-chip (SoC) with a scaler embedded therein, and may convert the digital video data DATA of an input image into a format suitable for displaying the image on the display panel 110. The host system 170 may transmit the digital video data DATA and the timing signals to the timing controller 160.

In addition to the data lines DL1 to DLm and the scan lines SL1 to SLn, a plurality of first and second touch electrodes may be provided in the display panel 110. The first touch electrodes may intersect the second touch electrodes. The first touch electrodes may be connected to a first touch driver 181 through a plurality of first touch lines T1 to Tj (where "j" is a positive integer greater than or equal to two). The second touch electrodes may be connected to a second touch driver 182 through a plurality of second touch lines R1 to Ri (where "i" is a positive integer greater than or equal to two). A plurality of touch sensors may be respectively provided in intersection portions of the first touch electrodes and the second electrodes. In an embodiment of the present disclosure, each of the touch sensors may be implemented, for example, with a mutual capacitor, but embodiments are not limited thereto. A disposition structure of the first and second touch electrodes will be described below in detail with reference to FIGS. 4 and 5.

The touch driver 180 may supply a driving pulse to the first touch electrodes through the first touch line T1 to Tj, and may sense charging variations of the touch sensors through the second touch lines R1 to Ri. That is, in FIG. 2, it is illustrated that the first touch line T1 to Tj are Tx lines through which the driving pulse may be supplied, and the second touch lines R1 to Ri are Rx lines through which the charging variations of the touch sensors may be respectively sensed.

The touch driver 180 may include a first touch driver 181, a second touch driver 182, and a touch controller 183. The first touch driver 181, the second touch driver 182, and the touch controller 183 may be integrated into one readout integrated chip (ROIC).

The first touch driver 181 may select a first touch line through which the driving pulse is to be output, based on control by the touch controller 183, and may supply the driving pulse to the selected first touch line. For example, the driving pulse may be provided in plurality, and the first touch driver 181 may sequentially supply the driving pulses to the first touch lines T1 to Tj.

The second touch driver 182 may select second touch lines through which charging variations of touch sensors are to be received, based on control by the touch controller 183, and may receive the charging variations of the touch sensors through the selected second touch lines. The second touch driver 182 may sample the charging variations of the touch sensors received through the second touch lines R1 to Ri to convert the charging variations into touch raw data TRD, which are digital data.

The touch controller 183 may generate a Tx setup signal for setting a first touch line, to which the driving pulse is to be output from the first touch driver 181, and an Rx setup signal for setting a second touch line through which a touch sensor voltage is to be received from the second touch driver 182. Also, the touch controller 183 may generate timing control signals for controlling the operation timings of the first touch driver 181 and the second touch driver 182.

The touch coordinate calculator 190 may receive the touch raw data TRD from the touch driver 180. The touch coordinate calculator 190 may calculate touch coordinates, based on a touch coordinate calculation method, and may output touch coordinate data HIDxy, including information about the touch coordinates, to the host system 170.

The touch coordinate calculator 190 may be implemented with a microcontroller unit (MCU). The host system 170 may analyze the touch coordinate data HIDxy input from the touch coordinate calculator 190 to execute an application program associated with coordinates where a touch has been performed by a user. The host system 170 may transmit the digital video data DATA and the timing signals to the timing controller 160 according to the executed application program.

The touch driver 180 may be included in the source drive ICs 131, or may be manufactured as a separate driving chip and mounted on the circuit board 150. Also, the touch coordinate calculator 190 may be manufactured as a separate driving chip and mounted on the circuit board 150.

Figure 3:
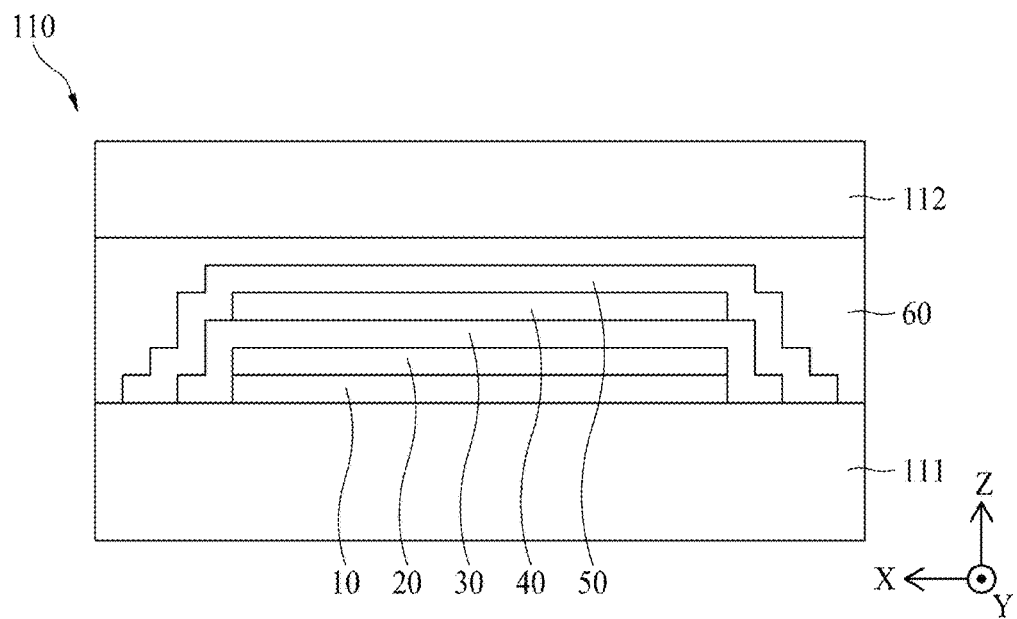
FIG. 3 is a cross-sectional view illustrating one side of the display panel of FIG. 1.

FIG. 3 is a cross-sectional view illustrating one side of the display panel of FIG. 1.

With reference to FIG. 3, the display panel 110 may include a first substrate 111, a second substrate 112, a thin film transistor (TFT) layer 10 disposed between the first and second substrates 111 and 112, a light-emitting device layer 20, a first encapsulation layer 30, a touch sensing layer 40, a second encapsulation layer 50, and an adhesive layer 60. The first substrate 111 may be a plastic film, a glass substrate, or the like.

The TFT layer 10 may be formed on the first substrate 111. The TFT layer 10 may include the scan lines, the data lines, and a plurality of TFTs. The TFTs may each include a gate electrode, a semiconductor layer, a source electrode, and a drain electrode. When the scan driver is provided as the GIP type, the scan driver may be formed along with the TFT layer 10. The TFT layer 10 will be described below in detail with reference to FIGS. 6 to 8.

The light-emitting device layer 20 may be provided on the TFT layer 10. The light-emitting device layer 20 may include a plurality of first electrodes, a light-emitting layer, a second electrode, and a plurality of banks. The light-emitting layer may include an organic light-emitting layer, including an organic material. In this case, the light-emitting layer may include a hole transporting layer, an organic light-emitting layer, and an electron transporting layer. When a voltage is applied to the first electrode and the second electrode, a hole and an electron may move to the organic light-emitting layer through the hole transporting layer and the electron transporting layer, and may be combined with each other in the organic light-emitting layer to emit light. The light-emitting device layer 20 may be a pixel array layer in which pixels may be provided. Thus, an area in which the light-emitting device layer 20 is provided may be defined as a display area. A peripheral area of the display area, or around the display area, may be defined as a non-display area. The light-emitting device layer 20 will be described below in detail with reference to FIGS. 6 and 7.

The first encapsulation layer 30 may be formed on the light-emitting device layer 20. The first encapsulation layer 30 may reduce or prevent oxygen or water from penetrating into the light-emitting device layer 20. The first encapsulation layer 30 may include at least one inorganic layer and at least one organic layer. A cross-sectional structure of the first encapsulation layer 30 will be described below in detail with reference to FIGS. 6 to 8.

The touch sensing layer 40 may be provided on the first encapsulation layer 30. The touch sensing layer 40 may include first and second touch electrode layers for sensing a user's touch. The first touch electrode layer may include a plurality of first touch electrodes connected to the first touch lines T1 to Tj, and a plurality of second touch electrodes connected to the second touch lines R1 to Ri. The second touch electrode layer may include a plurality of bridge electrodes that may connect the first touch electrodes or the second touch electrodes. In an embodiment of the present disclosure, when the touch sensing layer 40 for sensing a user touch is formed on the first encapsulation layer 30, it may not be required that a touch screen device is separately attached on a display apparatus. A plane structure of the touch sensing layer 40 will be described below with reference to FIGS. 4 and 5. Also, a cross-sectional structure of the touch sensing layer 40 will be described below in detail with reference to FIGS. 6 to 8.

The second encapsulation layer 50 may be formed on the touch sensing layer 40. The second encapsulation layer 50 may reduce or prevent oxygen or water from penetrating into the touch sensing layer 40. The second encapsulation layer 50 may include at least one inorganic layer. A cross-sectional structure of the second encapsulation layer 50 will be described below in detail with reference to FIGS. 6 to 8.

The adhesive layer 60 may be provided on the second encapsulation layer 50. The adhesive layer 60 may attach the second substrate 112 to the first substrate 111 on which the TFT layer 10, the light-emitting device layer 20, the first encapsulation layer 30, the touch sensing layer 40, and the second encapsulation layer 50 may be provided. The adhesive layer 60 may be an optically clear resin (OCR) layer, an optically clear adhesive (OCA) film, or the like.

The second substrate 112 may act as a cover substrate or a cover window, which may cover the first substrate 111. The second substrate 112 may be a plastic film, a glass substrate, an encapsulation film (a protective film), or the like.

Figure 4:
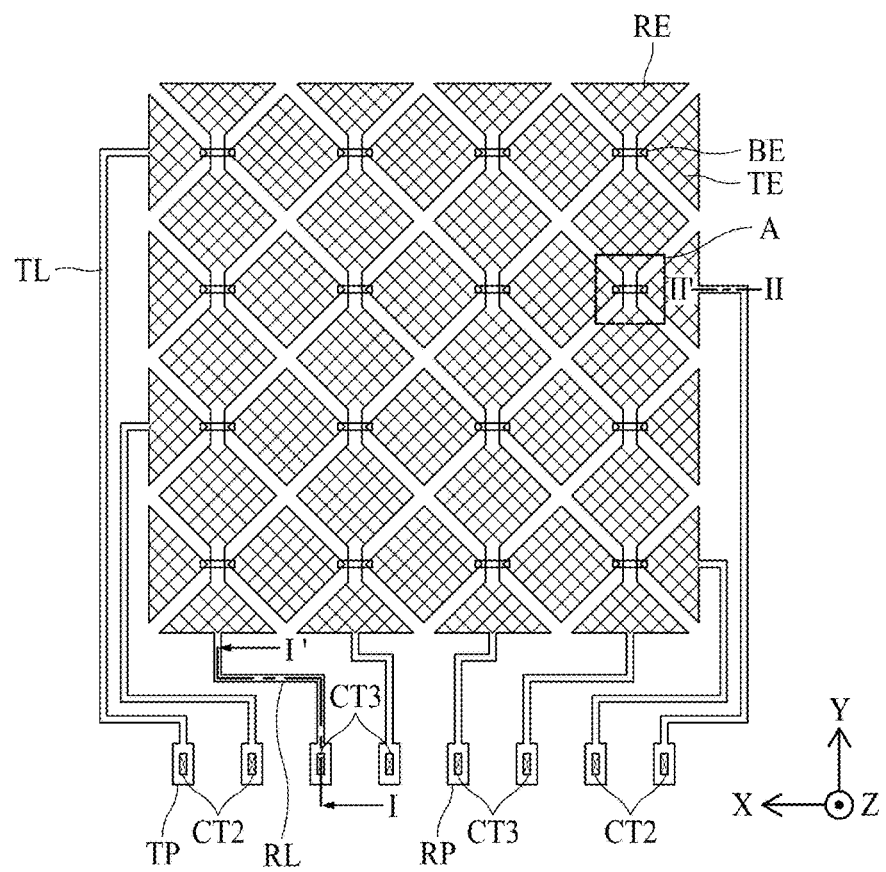
FIG. 4 is a plan view illustrating first touch electrodes, second touch electrodes, bridge electrodes, first touch lines, and second touch lines of a display apparatus with an integrated touch screen according to an embodiment of the present disclosure.

FIG. 4 is a plan view illustrating first touch electrodes, second touch electrodes, bridge electrodes, first touch lines, and second touch lines of a display apparatus with an integrated touch screen according to an embodiment of the present disclosure.

With reference to FIG. 4, a plurality of first touch electrodes TE may be arranged in a first direction (e.g., an x-axis direction), and a plurality of second touch electrodes RE may be arranged in a second direction (e.g., a y-axis direction) intersecting the first direction (e.g., the X-axis direction). The first direction (e.g., the x-axis direction) may be a direction parallel to the scan lines SL1 to SLn, and the second direction (e.g., the y-axis direction) may be a direction parallel to the data lines DL1 to DLm. Alternatively, the first direction (e.g., the x-axis direction) may be a direction parallel to the data lines DL1 to DLm, and the second direction (e.g., the y-axis direction) may be a direction parallel to the scan lines SL1 to SLn. In FIG. 4, an example in which the first touch electrodes TE and the second touch electrodes RE have a diamond-shaped plane structure is illustrated, but embodiments of the present disclosure are not limited thereto.

To avoid or prevent the first touch electrodes TE and the second touch electrodes RE from being short-circuited in intersection areas therebetween, the first touch electrodes TE, which may be adjacent to each other in the first direction (e.g., the x-axis direction) may be electrically connected to one another through a plurality of bridge electrodes BE. A mutual capacitance corresponding to a touch sensor may be generated in an intersection area of each of the first touch electrodes TE and a corresponding second touch electrode RE.

Moreover, each of first touch electrodes TE connected to each other in the first direction (e.g., the x-axis direction) may be spaced apart from and electrically insulated from first touch electrodes TE adjacent thereto in the second direction (e.g., the y-axis direction). Each of second touch electrodes RE connected to each other in the second direction (e.g., the y-axis direction) may be spaced apart from and electrically insulated from second touch electrodes RE adjacent thereto in the first direction (e.g., the x-axis direction).

A first touch electrode TE, disposed in one side end among first touch electrodes TE connected to each other in the first direction (e.g., the x-axis direction), may be connected to a first touch line TL. The first touch line TL may be connected to the first touch driver 181 through a first touch pad TP. Therefore, the first touch electrodes TE, connected to each other in the first direction (e.g., the x-axis direction), may receive a touch driving signal from the first touch driver 181 through the first touch line TL.

A second touch electrode RE, disposed in one side end among second touch electrodes RE connected to each other in the second direction (e.g., the y-axis direction), may be connected to a second touch line RL. The second touch line RL may be connected to the second touch driver 182 through a second touch pad RP. Therefore, the second touch driver 182 may receive charging variations of touch sensors of the second touch electrodes RE connected to each other in the second direction (e.g., the y-axis direction).

Figure 5:
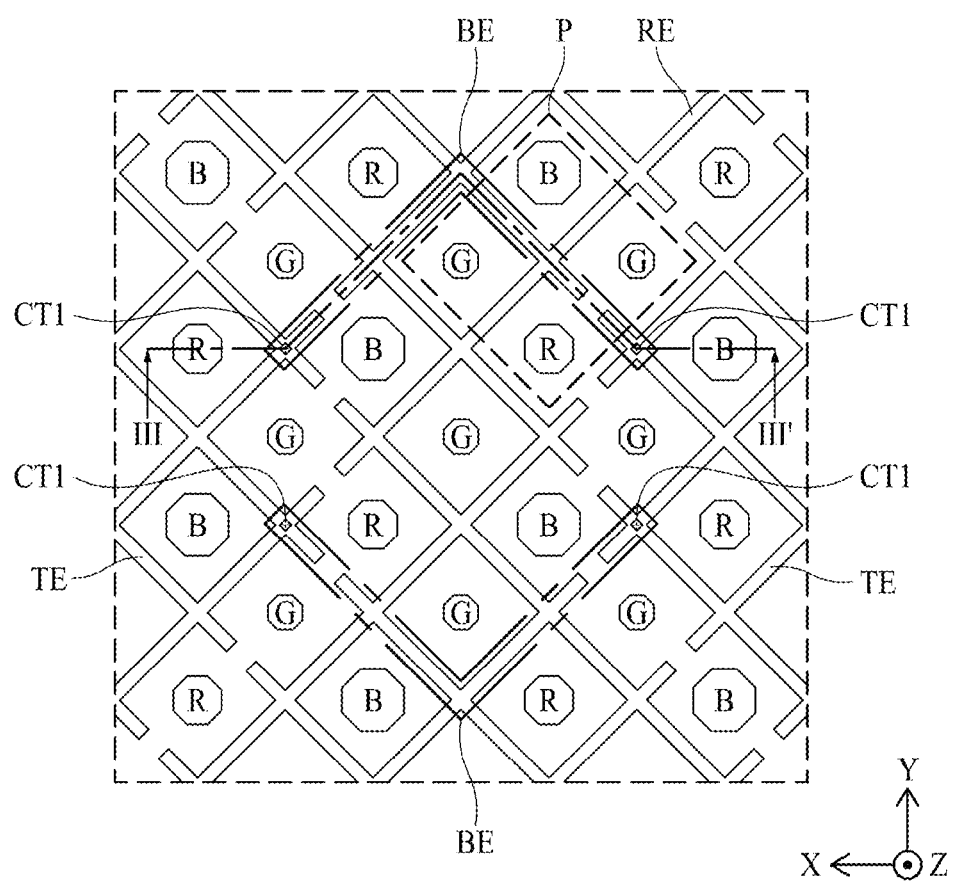
FIG. 5 is an enlarged view illustrating in detail an example of region A of FIG. 4.

FIG. 5 is an enlarged view illustrating in detail an example of region A of FIG. 4.

With reference to FIG. 5, a plurality of pixels P may be provided in a PENTILE® structure. For example, each of the pixels P may include a plurality of subpixels SP. For example, as shown in FIG. 5, each of the pixels P may include one red subpixel R, two green subpixels G, and one blue subpixel B. The red subpixel R, the green subpixels G, and the blue subpixel B may be provided as an octagonally planar type. For example, a size of the blue subpixel B among the red subpixel R, the green subpixels G, and the blue subpixel B may be largest. For example, a size of each of the green subpixels G may be smallest among the subpixels. In FIG. 5, an example in which the pixels P are provided in the pentile structure is illustrated, but embodiments of the present disclosure are not limited thereto.

The first touch electrodes TE and the second touch electrodes RE may be provided in a mesh structure to not overlap the red subpixel R, the green subpixels G, and the blue subpixel B of the pixels P. That is, the first touch electrodes TE and the second touch electrodes RE may be provided on a bank that may be between the red subpixel R, the green subpixels G, and the blue subpixel B.

First touch electrodes TE, which may be adjacent to each other in the first direction (e.g., the x-axis direction), may be electrically connected to each other through a plurality of bridge electrodes BE. The bridge electrodes BE may be respectively connected to first touch electrodes TE, adjacent to each other, through first contact holes CT1 exposing the first touch electrodes TE. Each of the bridge electrodes BE may overlap a corresponding first touch electrode TE and a corresponding second touch electrode RE. Each of the bridge electrodes BE may be provided on the bank, which may be between the red subpixel R, the green subpixels G, and the blue subpixel B.

The first and second touch electrodes TE and RE may be on the same layer. The bridge electrodes BE may be on a layer that differs from a layer on which the first and second touch electrodes TE and RE are disposed.

Figure 6:
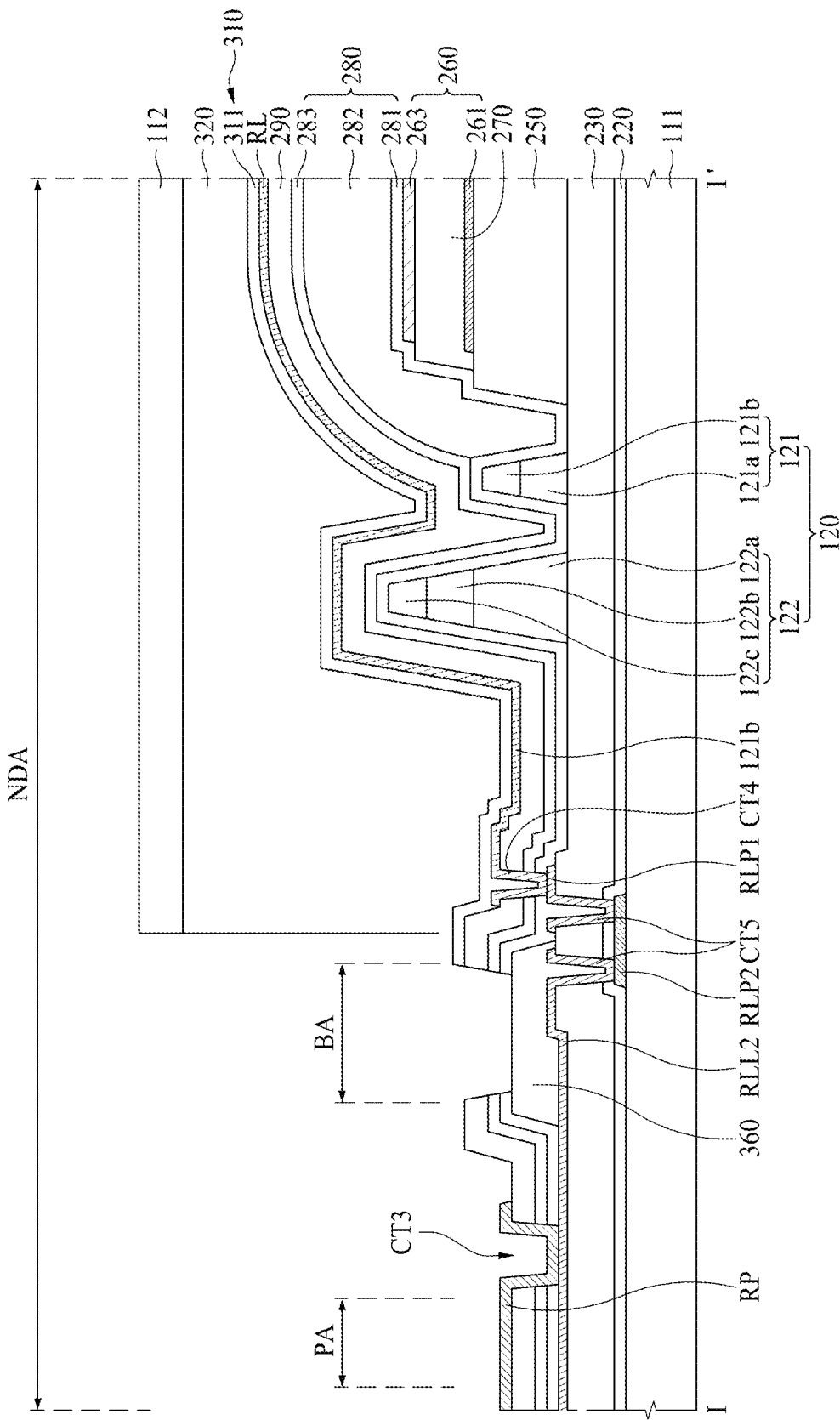
FIG. 6 is a cross-sectional view illustrating a first embodiment taken along line I-I' of FIG. 4.
Figure 7:
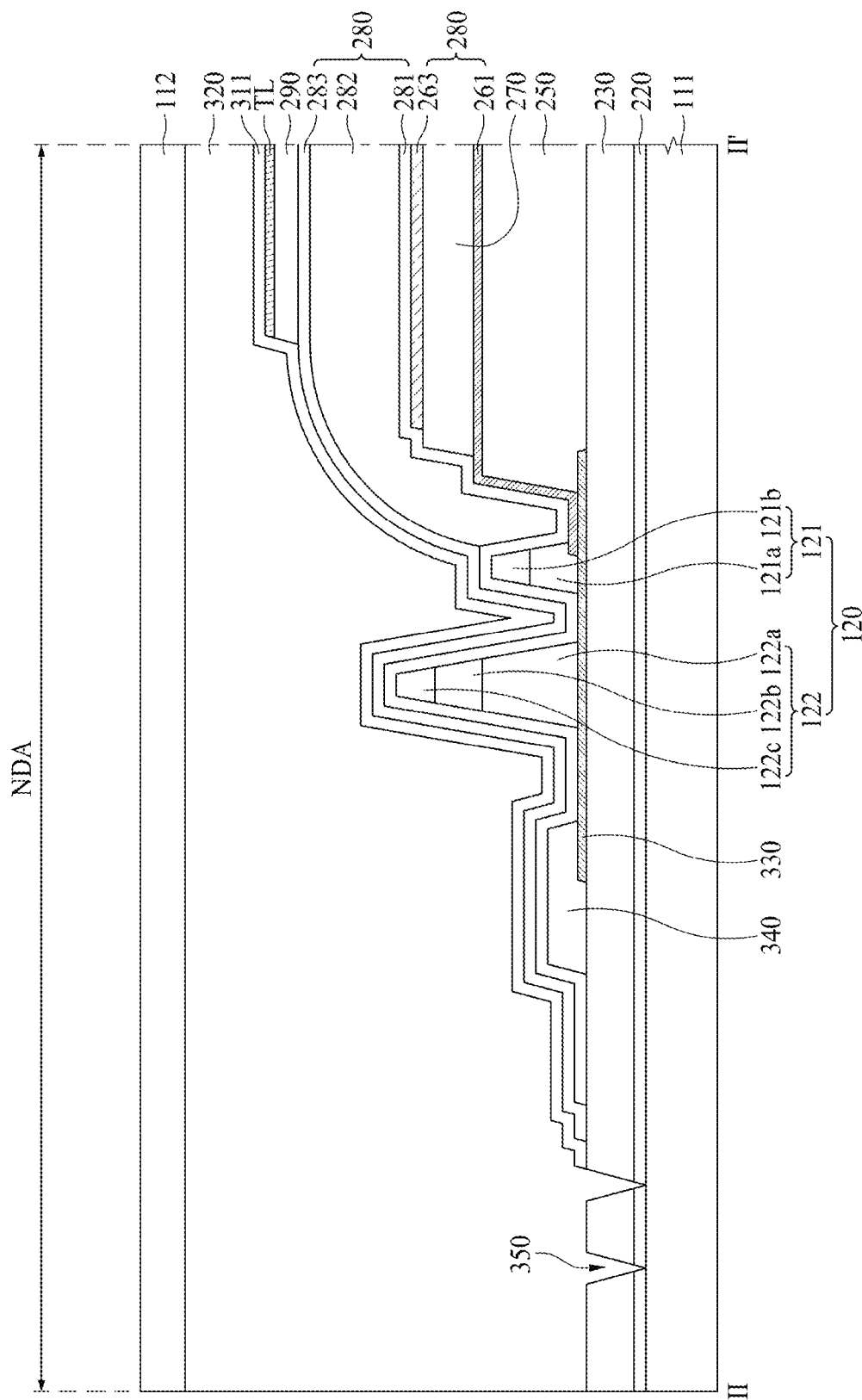
FIG. 7 is a cross-sectional view illustrating a first embodiment taken along line II-II' of FIG. 4.
Figure 8:
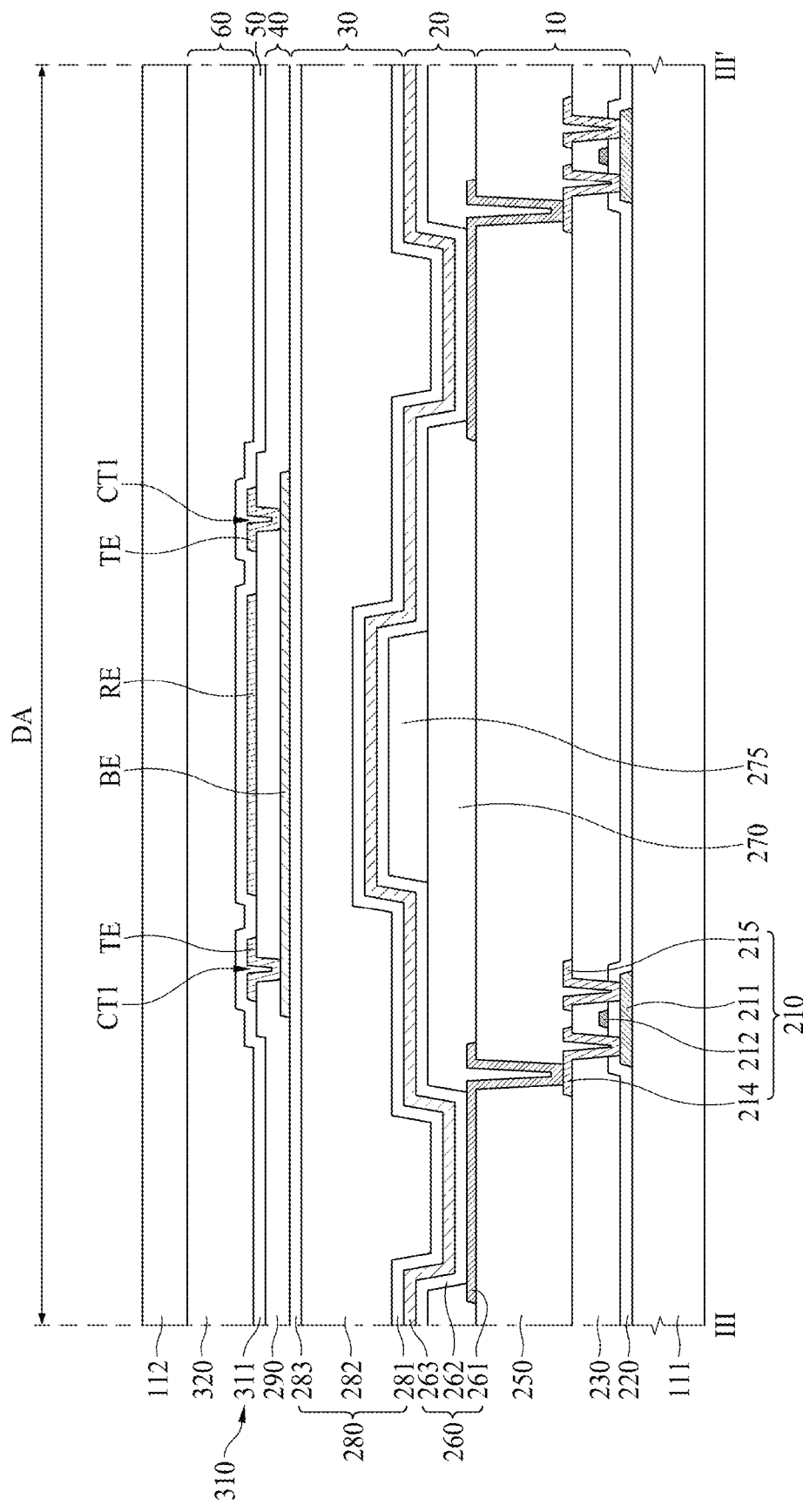
FIG. 8 is a cross-sectional view illustrating a first embodiment taken along line III-III' of FIG. 5.

FIG. 6 is a cross-sectional view illustrating a first embodiment taken along line I-I' of FIG. 4. FIG. 7 is a cross-sectional view illustrating a first embodiment taken along line II-II' of FIG. 4. FIG. 8 is a cross-sectional view illustrating a first embodiment taken along line III-III' of FIG. 5.

In FIG. 6, a connection structure of the second touch line RL and the second touch pad RP is illustrated in detail. In FIG. 8, a connection structure of the bridge electrode BE and the first touch electrodes TE is illustrated in detail.

With reference to FIGS. 6 to 8, a TFT layer 10 may be provided on a first substrate 111. The TFT layer 10 may include a plurality of TFTs 210, first and second touch pads TP and RP, a gate insulation layer 220, an interlayer insulation layer 230, and a planarization layer 250.

A first buffer layer may be formed on one surface of the first substrate 111. The first buffer layer may be formed on the one surface of the first substrate 111, for protecting the TFTs 210 and a plurality of organic light-emitting devices 260 from water penetrating through the first substrate 111 vulnerable to penetration of water. The one surface of the first substrate 111 may be a surface facing the second substrate 112. The first buffer layer may be formed of a plurality of inorganic layers which are alternately stacked. For example, the first buffer layer may be formed of a multilayer in which one or more inorganic layers, e.g., of silicon oxide (SiO$_x$), silicon nitride (SiN$_x$), and/or SiON, may be alternately stacked. Embodiments are not limited to these examples. The first buffer layer may be omitted.

The TFTs 210 may be formed on the first buffer layer. The TFTs 210 may each include an active layer 211, a gate electrode 212, a source electrode 214, and a drain electrode 215. In FIG. 8, the TFTs 210 are illustrated, for example, as being a top-gate type in which the gate electrode 212 is on the active layer 211, but embodiments are not limited thereto. That is, the TFTs 210 may be a bottom-gate type in which the gate electrode 212 is under the active layer 211, or may be a double gate type in which the gate electrode 212 is both on and under the active layer 211.

The active layer 211 may be on the first buffer layer. The active layer 211 may be formed, e.g., of a silicon-based semiconductor material, an oxide-based semiconductor material, and/or the like. A light blocking layer (not shown) for blocking external light incident on the active layer 211 may be between the first buffer layer and the active layer 211.

The gate insulation layer 220 may be on the active layer 211. The gate insulation layer 220 may be formed, e.g., of an inorganic layer, and for example, may be formed of SiO$_x$, SiN$_x$, or a multilayer thereof. Embodiments are not limited to these examples.

The gate electrode 212 and a gate line may be on the gate insulation layer 220. The gate electrode 212 and the gate line may each be formed of a single layer or a multilayer, which may include one or more of: molybdenum (Mo), aluminum (Al), chromium (Cr), gold (Au), titanium (Ti), nickel (Ni), neodymium (Nd), and copper (Cu), and/or an alloy thereof. Embodiments are not limited to these examples.

The interlayer insulation layer 230 may be on the gate electrode 212 and the gate line. The interlayer insulation layer 230 may be formed, e.g., of an inorganic layer, and for example, may be formed of SiO$_x$, SiN$_x$, or a multilayer thereof. Embodiments are not limited to these examples.

The source electrode 214, the drain electrode 215, a data line, a power line 330, and first and second touch pads TP and RP may be on the interlayer insulation layer 230. Each of the source electrode 214 and the drain electrode 215 may be connected to the active layer 211 through a contact hole that passes through the gate insulation layer 220 and the interlayer insulation layer 230. The source electrode 214, the drain electrode 215, the data line, the power line, and the first and second touch pads TP and RP may each be formed of a single layer, or as a multilayer, which may include one or more of. Mo, Al, Cr, Au, Ti, Ni, Nd, Cu, and/or an alloy thereof. Embodiments are not limited to these examples.

A passivation layer for insulating the TFTs 220 may formed on the source electrode 214, the drain electrode 215, the data line, and the power line 330. The passivation layer may be formed of an inorganic layer, and for example, may be formed of SiO$_x$, SiN$_x$, or a multilayer thereof. Embodiments are not limited to these examples. The passivation layer may be omitted.

The planarization layer 250 for planarizing a step height caused by the TFTs 210 may be on the passivation layer. The planarization layer 250 may be formed, e.g., of an organic layer, such as acryl resin, epoxy resin, phenolic resin, polyamide resin, polyimide resin, and/or the like. Embodiments are not limited to these examples.

The light-emitting device layer 20 may be on the TFT layer 10. The light-emitting device layer 20 may include a plurality of light-emitting devices 260, a bank 270, and a spacer 275.

The light-emitting devices 260, the bank 270, and the spacer 275 may be on the planarization layer 250. The light-emitting devices 260 may each include a first electrode 261, an organic light-emitting layer 262, and a second electrode 263. The first electrode 261 may be an anode electrode, and the second electrode 263 may be a cathode electrode.

The first electrode 261 may be on the planarization layer 250. The first electrode 261 may be connected to the source electrode 214 of the TFT 210 through a contact hole that passes through the passivation layer 240 and the planarization layer 250. The first electrode 261 may be formed, e.g., of a metal material, which is high in reflectivity, such as a stacked structure (Ti/Al/Ti) of Al and Ti, a stacked structure (e.g., indium tin oxide (ITO)/Al/ITO) of Al and ITO, an APC alloy, or a stacked structure (ITO/APC/ITO) of an APC alloy and ITO. The APC alloy may be an alloy of silver (Ag), palladium (Pd), and Cu. Embodiments are not limited to these examples.

The bank 270 may be provided on the planarization layer 250 to divide the first electrode 261, for acting as a pixel defining layer that defines a plurality of subpixels SP. The bank 270 may cover an edge of the first electrode 261. The bank 270 may be formed, e.g., of an organic layer, such as acryl resin, epoxy resin, phenolic resin, polyamide resin, polyimide resin, or the like. Embodiments are not limited to these examples.

The spacer 275 may be on the bank 270. The spacer 275 may be formed, e.g., of an organic layer, such as acryl resin, epoxy resin, phenolic resin, polyamide resin, polyimide resin, or the like. Embodiments are not limited to these examples. The spacer 285 may be omitted.

Each of the subpixels SP may denote an area where the first electrode 261 corresponding to an anode electrode, the light-emitting layer 262, and the second electrode 263 corresponding to a cathode electrode are sequentially stacked, and a hole from the first electrode 261 and an electron from the second electrode 263 are combined with each other in the light-emitting layer 262 to emit light.

The light-emitting layer 262 may be provided on the first electrode 261, the bank 270, and the spacer 275. The light-emitting layer 262 may be an organic light-emitting layer, which may includes an organic material, and may emit light having a certain color. When the light-emitting layer 262 is a white light-emitting layer emitting white light, the light-emitting layer 262 may be a common layer provided in the pixels P in common. In this case, the light-emitting layer 262 may be formed in a tandem structure, including two or more stacks. Each of the stacks may include a hole transporting layer, at least one light-emitting layer, and an electron transporting layer.

Moreover, a charge generating layer may be provided between the stacks. The charge generating layer may include an n-type charge generating layer, disposed adjacent to a lower stack, and a p-type charge generating layer on the n-type charge generating layer and disposed adjacent to an upper stack. The n-type charge generating layer may inject an electron into the lower stack, and the p-type charge generating layer may inject a hole into the upper stack. The n-type charge generating layer may be formed, e.g., of an organic layer in which alkali metal, such as lithium (Li), sodium (Na), potassium (K), or cesium (Cs), or alkali earth metal, such as magnesium (Mg), strontium (Sr), barium (Ba), or radium (Ra) may be doped on an organic host material having an ability to transport electrons. Embodiments are not limited to these examples. The p-type charge generating layer may be an organic layer in which a dopant may be doped on an organic material having an ability to transport holes.

The second electrode 263 may be on the light-emitting layer 262. The second electrode 263 may cover the light-emitting layer 262. The second electrode 263 may be a common layer provided in the plurality of pixels P in common.

The second electrode 263 may be formed, e.g., of a transparent conductive material (e.g., a transparent conductive oxide (TCO)), such as indium tin oxide (ITO) or indium zinc oxide (IZO), capable of transmitting light, or a semi-transmissive conductive material, such as Mg, Ag, or an alloy of Mg and Ag. Embodiments are not limited to these examples. If the second electrode 263 is formed of a semi-transmissive conductive material, emission efficiency may be enhanced by a microcavity. A capping layer may be on the second electrode 263.

The first encapsulation layer 30 may be on the light-emitting device layer 260. The first encapsulation layer 30 may include a first encapsulation film 280 and a dam 120.

The dam 120 may be in a non-display area NDA surrounding an outer portion of a display area DA in which a plurality of pixels P may be provided. The dam 120 may surround the display area DA, and may block the flow of a first organic layer 282 configuring the first encapsulation film 280. The dam 120 may include a first dam 121 and a second dam 122.

The first dam 121 may surround the outer portion of the display area DA, and may primarily block the flow of the first organic layer 282 configuring the first encapsulation film 280. Also, the first dam 121 may be between the display area DA and the first and second touch pads TP and RP, and may primarily block the flow of the first organic layer 282 configuring the first encapsulation film 280 so that the first organic layer 282 may not penetrate into the first and second touch pads TP and RP. As shown in FIG. 6, a bending area BA, which may be bent, may be provided between the display area DA and the first and second touch pads TP and RP. In this case, the first dam 121 may be between the display area DA and the bending area BA, and may primarily block the flow of the first organic layer 282 configuring the first encapsulation film 280 so that the first organic layer 282 may not penetrate into the bending area BA.

The first dam 121 may be provided on the power line 330, through which a source voltage may be supplied to each of the pixels P, and on the first electrode 261 that may extend from the display area DA and contact the power line 330. The first dam 121 may include a first bottom layer 121a and a first top layer 121b. The first bottom layer 121a may be provided on the power line 330 or the first electrode 261. The first top layer 121b may be on the first bottom layer 121a.

The first bottom layer 121a and the first top layer 121b of the first dam 121 may be formed simultaneously with at least one of the planarization layer 250, the bank 270, and the spacer 275 of each of the pixels P, and may be formed of the same material as that of at least one of the planarization layer 250, the bank 270, and the spacer 275. For example, the first bottom layer 121a of the first dam 121 may be formed of the same material as that of the bank 270, and simultaneously with the bank 270. The first top layer 121b of the first dam 121 may be formed of the same material as that of the spacer 275, and simultaneously with the spacer 275. In this case, the first bottom layer 121a and the first top layer 121b of the first dam 121 may each be formed of an organic material, such as acryl resin, epoxy resin, phenolic resin, polyamide resin, polyimide resin, or the like. Embodiments are not limited to these examples.

In FIG. 7, the first dam 121 is illustrated as including the first bottom layer 121a and the first top layer 121b, but embodiments are not limited thereto. For example, the first dam 121 may be formed as a single-layer structure, including a bottom layer. In another example, the first dam 121 may be formed as a three-layer structure, including a bottom layer, an intermediate layer, and a top layer.

The second dam 122 may be outside the first dam 121, and may secondarily block the first organic layer 282 flowing to an outer portion of the first dam 121. Accordingly, the first dam 121 and the second dam 122 may effectively reduce or prevent the first organic layer 282 from being exposed at the outside of the display apparatus or from penetrating into the first and second touch pads TP and RP.

The second dam 122, as shown in FIG. 7, may be provided on the power line 330 through which the source voltage may be supplied to each of the pixels P. The second dam 122 may include a second bottom layer 122a, an intermediate layer 122b, and a second top layer 122c. The second bottom layer 122a may be on the power line 330. The intermediate layer 122b may be on the second bottom layer 122a, and the second top layer 122c may be on the intermediate layer 122b.

The second bottom layer 122a, the intermediate layer 122b, and the second top layer 122c of the second dam 122 may be formed simultaneously with at least one of the planarization layer 250, the bank 270, and the spacer 275 of each of the pixels P, and may be formed of the same material as that of at least one of the planarization layer 250, the bank 270, and the spacer 275. For example, the second bottom layer 122a of the second dam 122 may be formed of the same material as that of the bank 270, and simultaneously with the bank 270. The intermediate layer 122b of the second dam 122 may be formed of the same material as that of the bank 270, and simultaneously with the bank 270. The second top layer 122c of the second dam 122 may be formed of the same material as that of the spacer 275, and simultaneously with the spacer 275. In this case, the second bottom layer 122a, the intermediate layer 122b, and the second top layer 122c of the second dam 122 may each be formed of an organic material, such as acryl resin, epoxy resin, phenolic resin, polyamide resin, polyimide resin, or the like. Embodiments are not limited to these examples.

In FIG. 7, the second dam 122 is illustrated as including the second bottom layer 122a, the intermediate layer 122b, and the second top layer 122c, but embodiments are not limited thereto. For example, the second dam 122 may be formed as a single-layer structure, including a bottom layer. In another example, the second dam 122 may be formed as a two-layer structure, including a bottom layer and a top layer.

The first encapsulation film 280 may be on the second electrode 263 and the dam 120. The first encapsulation film 280 may include at least one inorganic layer and at least one organic layer, for preventing oxygen or water from penetrating into the light-emitting layer 262 and the second electrode 263. For example, the first encapsulation film 280 may include first and second inorganic layers 281 and 283, and a first organic layer 282 disposed between the first and second inorganic layers 281 and 283. Each of the first and second inorganic layers 281 and 283 may be formed, e.g., of silicon nitride ($SiN_x$), aluminum nitride (AlN), zirconium nitride (ZrN), titanium nitride (TiN), hafnium nitride (HfN), tantalum nitride (TaN), silicon oxide ($SiO_x$), aluminum oxide ($Al_2O_3$), titanium oxide, and/or the like. The first organic layer 282 may be have a sufficient thickness (for example, a thickness of about 7 μm to 8 μm), for preventing particles from penetrating into the light-emitting layer 262 and the second electrode 263 via the first encapsulation film 280.

The flow of the first organic layer 282 may be blocked by the first damp 121 and the second dam 122. Thus, the first organic layer 282 may be provided more inward than at least one of the first damp 121 and the second dam 122. On the other hand, the first and second inorganic layers 281 and 283 may be provided more outward than the first damp 121 and the second dam 122. Also, the first and second inorganic layers 281 and 283 may not cover the first and second touch pads TP and RP. When the bending area BA is provided, the first and second inorganic layers 281 and 283 may not be provided in the bending area BA, e.g., for preventing a crack from occurring when bending is performed.

In the display apparatus according to an embodiment of the present disclosure, the passivation layer provided on the TFT 210 and the capacitor 220 may be omitted. In this case, as shown in FIG. 7, the second inorganic layer 283 configuring the first encapsulation film 280 may be directly provided on the power line 330 in the non-display area NDA. In this case, a seam may occur in the second inorganic layer 283 due to a step height caused by the power line 330, and water may penetrate into the inside through the seam. To solve such a problem, the display apparatus according to an embodiment of the present disclosure may further include an organic passivation layer 340.

The organic passivation layer 340 may be in the non-display area NDA, and may be spaced apart from the dam 120. Also, the organic passivation layer 340 may cover an edge of the power line 330. That is, one end of the power line 330 may be covered by the planarization layer 250, and the other end may be covered by the organic passivation layer 340.

The organic passivation layer 340 may be formed simultaneously with at least one of the planarization layer 250, the bank 270, and the spacer 275 of each of the pixels P, and may be formed of the same material as that of at least one of the planarization layer 250, the bank 270, and the spacer 275. For example, the organic passivation layer 340 may be formed of the same material as that of the bank 270, and simultaneously with the bank 270. In this case, the organic passivation layer 340 may be formed of an organic material such as acryl resin, epoxy resin, phenolic resin, polyamide resin, polyimide resin, or the like. Embodiments are not limited to these examples.

A crack prevention groove 350 may be further provided in an edge region to expose the first substrate 111. When cracks occur in the gate insulation layer 220 and the interlayer insulation layer 230, e.g., due to an external impact, the crack prevention groove 350 may prevent the cracks from propagating along the gate insulation layer 220 and the interlayer insulation layer 230.

A touch sensing layer 40 may be formed on the first encapsulation layer 30. The touch sensing layer 40 may include a plurality of first touch electrodes TE, a plurality of second touch electrodes RE, a plurality of bridge electrodes BR, and a touch insulation layer 290.

The first and second touch electrodes TE and RE may be on the same layer. The first and second touch electrodes TE and RE may be spaced apart and electrically insulated from each other. The touch insulation layer 290 may include a touch inorganic layer and a touch organic layer.

In detail, the bridge electrodes BE may be on the first encapsulation layer 30. The bridge electrodes BE may each be formed, e.g., of a single layer or a multilayer, which may include one or more of: Mo, Al, Cr, Au, Ti, Ni, Nd, Cu, and/or an alloy thereof. Embodiments are not limited to these examples.

In FIGS. 6 to 8, it is illustrated that the bridge electrodes BE are directly provided on the second inorganic layer 283 configuring the first encapsulation film 280, but embodiments of the present disclosure are not limited thereto. For example, a second buffer layer may be separately provided between the second inorganic layer 283 of the first encapsulation film 280 and the bridge electrodes BE. The second buffer layer may cover the first encapsulation film 280 and the first and second touch pads TP and RP. The second buffer layer may be formed of an inorganic layer or an organic layer. When the second buffer layer is formed of an inorganic layer, the second buffer layer may be formed, e.g., of $SiO_x$, $SiN_x$, or a multilayer thereof, although embodiments are not limited thereto. When the second buffer layer is formed of an organic layer, a surface roughness of the second buffer layer may be roughened by performing plasma treatment on the second buffer layer. In this case, an area of the second buffer layer contacting the bridge electrodes BE may increase. Thus, an interface adhesive force between the second buffer layer and the bridge electrodes BE may increase.

A touch inorganic layer may be on the bridge electrodes BE. The touch inorganic layer may be formed, e.g, of an inorganic layer, and, for example, may be formed of $SiO_x$, $SiN_x$, or a multilayer thereof.

A touch organic layer may be on the touch inorganic layer. Contact holes may be formed in the touch organic layer. Thus, the touch organic layer may include a photosensitive material. For example, the touch organic layer may be formed, e.g., of photo acrylate including a photosensitive material. Embodiments are not limited to these examples.

The touch inorganic layer may reduce or prevent the touch organic layer from being partially detached between the bridge electrodes BE and the touch organic layer. An interface adhesive force between the bridge electrodes BE and the touch inorganic layer may be higher than an interface adhesive force between the bridge electrodes BE and the touch organic layer. Thus, when the touch inorganic layer is provided between the bridge electrodes BE and the touch organic layer, the touch organic layer may be prevented from being partially detached between the bridge electrodes BE and the touch organic layer. Also, along with the first and second inorganic layers 281 and 283 of the first encapsulation layer 30, the touch inorganic layer may prevent oxygen or water from penetrating into the light-emitting layer 262 and the second electrode 263.

In FIGS. 6 to 8, the touch insulation layer 290 is illustrated as including the touch inorganic layer and the touch organic layer, but embodiments are not limited thereto. For example, the touch insulation layer 290 may include one of the touch inorganic layer and the touch organic layer.

The first touch electrodes TE and the second touch electrodes RE may be on the touch organic layer. The first touch electrodes TE may be connected to the bridge electrodes BE through first contact holes CT1 that pass through the touch inorganic layer and the touch organic layer and may expose the bridge electrodes BE. Therefore, the first touch electrodes TE may be connected to each other by using the bridge electrodes BE in intersection areas of the first touch electrodes TE and the second touch electrodes RE. Thus, the first touch electrodes TE and the second touch electrodes RE may not be short-circuited with one another. Also, the first touch electrodes TE and the second touch electrodes RE may overlap the bank 270 to prevent an opening area of each subpixel SP from being reduced.

A first touch line TL may extend from the first touch electrode TE, and a second touch line RL may extend from the second touch electrode RE. The first touch line TL may be connected to the first touch pad TP through a second contact hole CT2 that passes through the first and second inorganic layers 281 and 283 of the first encapsulation film 280 and the touch insulation layer 290. When the bending area BA is provided, the first touch line TL may extend from the display area DA to a pad area PA by using at least two first touch connection lines. For example, the first touch line TL may include two first touch connection lines and two first touch connection patterns. One first touch connection line may extend from the first touch electrode TE, and may be connected to one first touch connection pattern through a contact hole that passes through the first and second inorganic layers 281 and 283 of the first encapsulation film 280 and the touch insulation layer 290. One first touch connection pattern may be on the same layer as the source electrode 214 and the drain electrode 215, and may be connected to one other first touch connection pattern through a contact hole that passes through the gate insulation layer 220 and the interlayer insulation layer 230. The one other first touch connection pattern may be on the same layer as the gate electrode 211, and may be connected to one other first touch connection line through a contact hole that passes through the gate insulation layer 220 and the interlayer insulation layer 230. The one other first touch connection line may extend to the pad area PA, and may be connected to the first touch pad TP through the second contact hole CT2.

The second touch line RL may be connected to the second touch pad RP through a third contact hole CT3 that passes through the first and second inorganic layers 281 and 283 of the first encapsulation film 280 and the touch insulation layer 290. When the bending area BA is provided, the second touch line RL may extend from the display area DA to the pad area PA by using at least two second touch connection lines. For example, as shown in FIG. 6, the second touch line RL may include two second touch connection lines RLL1 (not shown) and RLL2 and two second touch connection patterns RLP1 and RLP2.

One second touch connection line RLL1 may extend from the second touch electrode RE, and may be connected to one second touch connection pattern RLP1 through a fourth contact hole CT4 that passes through the first and second inorganic layers 281 and 283 of the first encapsulation film 280 and the touch insulation layer 290. One second touch connection pattern RLP1 may be on the same layer as the source electrode 214 and the drain electrode 215, and may be connected to one other second touch connection pattern RLP2 through a fifth contact hole CT5 that passes through the gate insulation layer 220 and the interlayer insulation layer 230. The one other second touch connection pattern RLP2 may be on the same layer as the gate electrode 211, and may be connected to one other second touch connection line RLL2 through the fifth contact hole CT5 that passes through the gate insulation layer 220 and the interlayer insulation layer 230.

The one other second touch connection line RLL2 may be on the same layer as the source electrode 214 and the drain electrode 215 to extend to the pad area PA via the bending area BA, and may be connected to the second touch pad RP through the third contact hole CT3. The one other second touch connection line RLL2 may be covered by the passivation layer 360 in the bending area BA.

The first touch electrodes TE, the second touch electrodes RE, the first touch lines TL, and the second touch lines RL may each be formed, e.g., of a single layer or a multilayer which may include one or more of: Mo, Al, Cr, Au, Ti, Ni, Nd, Cu, and/or an alloy thereof. Embodiments are not limited to these examples.

In FIGS. 6 to 8, an example in which the bridge electrodes BE are on the first encapsulation film 280, the touch insulation layer 290 is on the bridge electrodes BE, and the first touch electrodes TE and the second touch electrodes RE are on the touch insulation layer 290 is illustrated, but embodiments of the present disclosure are not limited thereto. For example, the first touch electrodes TE and the second touch electrodes RE may be on the first encapsulation film 280, the touch insulation layer 290 may be on the first touch electrodes TE and the second touch electrodes RE, and the bridge electrode BE may be on the touch insulation layer 290.

A second encapsulation layer 50 may be on the touch sensing layer 40. The second encapsulation layer 50 may include a second encapsulation film 310.

The second encapsulation film 310 may be on the first and second touch electrodes TE and RE. The second encapsulation film 310 may include at least one inorganic layer, for preventing oxygen or water from penetrating into the first and second touch electrodes TE and RE. For example, the second encapsulation film 310 may include a third inorganic layer 311. The third inorganic layer 311 may be formed, e.g., of silicon nitride, aluminum nitride, zirconium nitride, titanium nitride, hafnium nitride, tantalum nitride, silicon oxide, aluminum oxide, titanium oxide, and/or the like. Embodiments are not limited to these examples.

The third inorganic layer 311 may cover the first dam 121, the second dam 122, and the display area DA. When the organic passivation layer 340 is provided, the third inorganic layer 311 may cover the organic passivation layer 340.

Moreover, the third inorganic layer 311 may not cover the first and second touch pads TP and RP. When the bending area BA is provided, the third inorganic layer 311 may not be provided in the bending area BA, for preventing a crack from occurring when bending is performed.

A color filter layer may be on the second encapsulation layer 50. The color filter layer may include a plurality of color filters, which may overlap subpixels SP, and a black matrix that may overlap the bank 270. When the light-emitting layer 262 includes a plurality of organic light-emitting layers that may emit red, green, and blue light, the color filter layer may be omitted.

An adhesive layer 60 may be on the second encapsulation layer 50. The adhesive layer 60 may attach the second substrate 112 to the first substrate 111 on which the TFT layer 10, the light-emitting device layer 20, the first encapsulation layer 30, the touch sensing layer 40, and the second encapsulation layer 50 may be provided. The adhesive layer 60 may be an optically clear resin (OCR) layer, an optically clear adhesive (OCA) film, and/or the like. Embodiments are not limited to these examples.

The second substrate 112 may act as a cover substrate or a cover window, which may cover the first substrate 111. The second substrate 112 may be a plastic film, a glass substrate, an encapsulation film (e.g., a protective film), or the like. Embodiments are not limited to these examples.

In the display apparatus with an integrated touch screen according to an embodiment of the present disclosure, the second encapsulation layer 50, including the third inorganic layer 311, may be provided on the touch sensing layer 40, thereby preventing oxygen or water from penetrating into the first and second touch electrodes TE and RE. Moreover, in the display apparatus with an integrated touch screen according to an embodiment of the present disclosure, the third inorganic layer 311 may be attached to the adhesive layer 60. The third inorganic layer 311 may have an adhesive force that is higher than an organic layer, thereby enhancing an adhesive force between the second substrate 112 on the first substrate 111 on which the TFT layer 10, the light-emitting device layer 20, the first encapsulation layer 30, the touch sensing layer 40, and the second encapsulation layer 50 may be disposed. Accordingly, an interface between the third inorganic layer 311 and the adhesive layer 60 may be prevented from being peeled.

Figure 9:
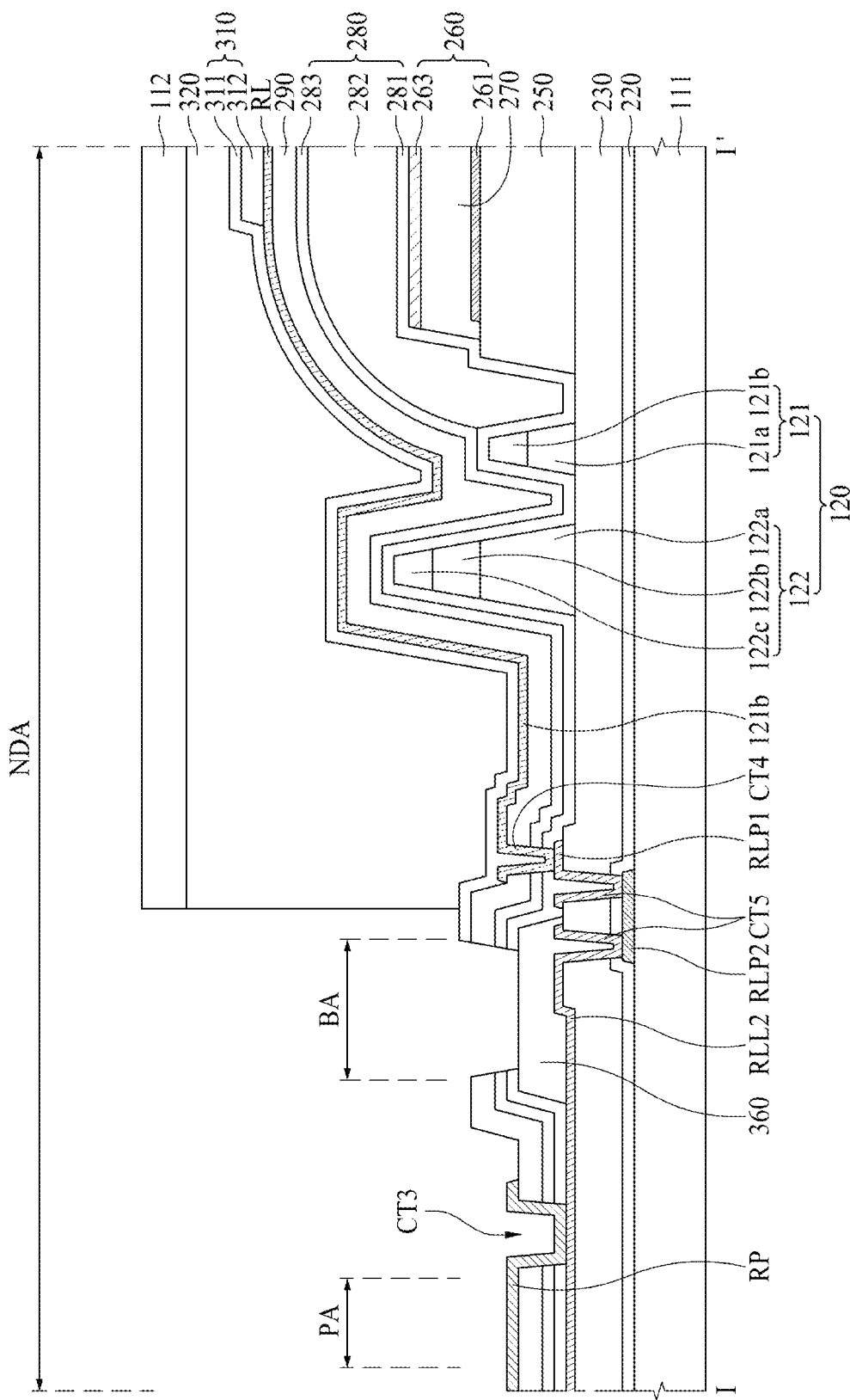
FIG. 9 is a cross-sectional view illustrating a second embodiment taken along line I-I' of FIG. 4.
Figure 10:
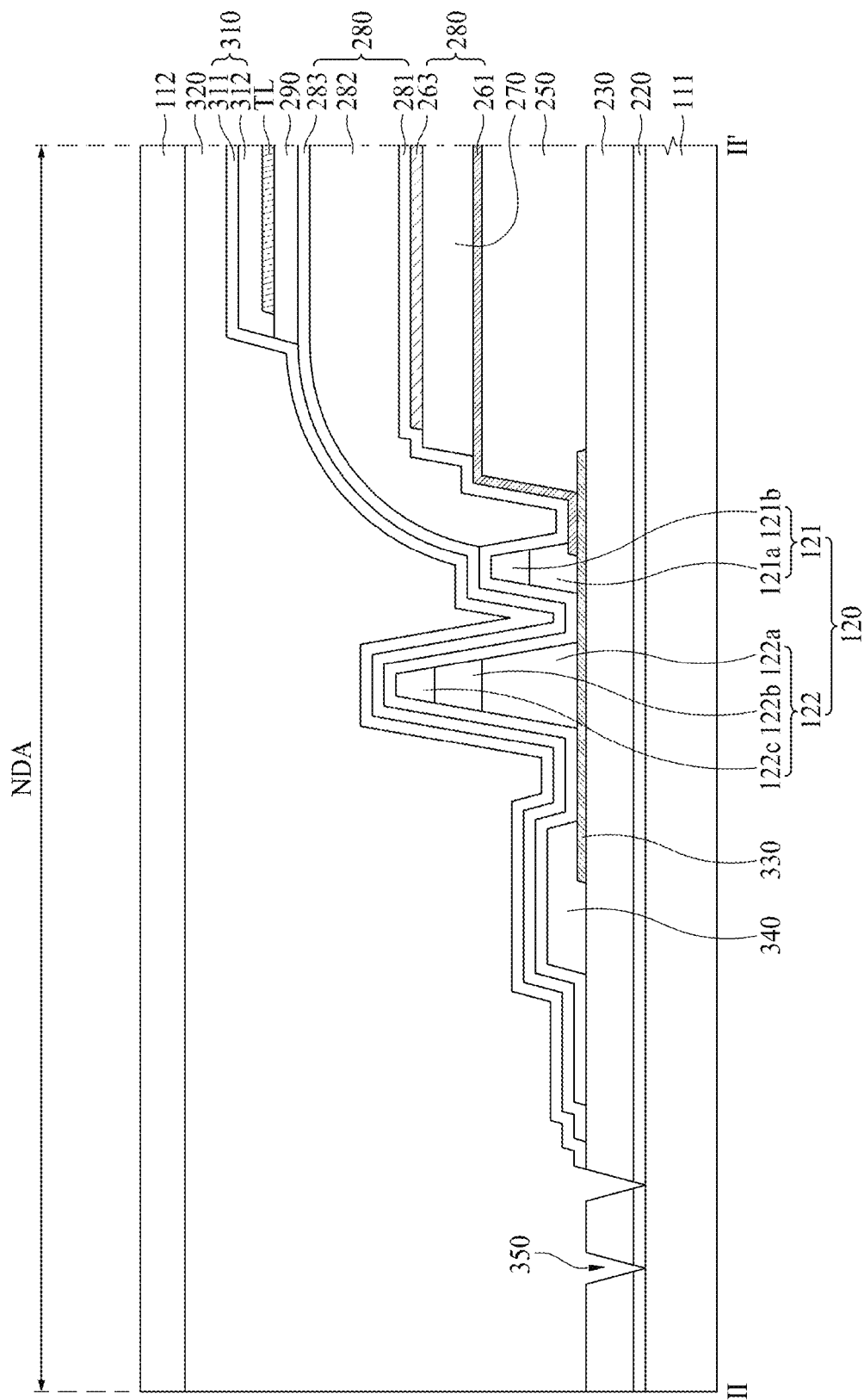
FIG. 10 is a cross-sectional view illustrating a second embodiment taken along line II-II' of FIG. 4.
Figure 11:
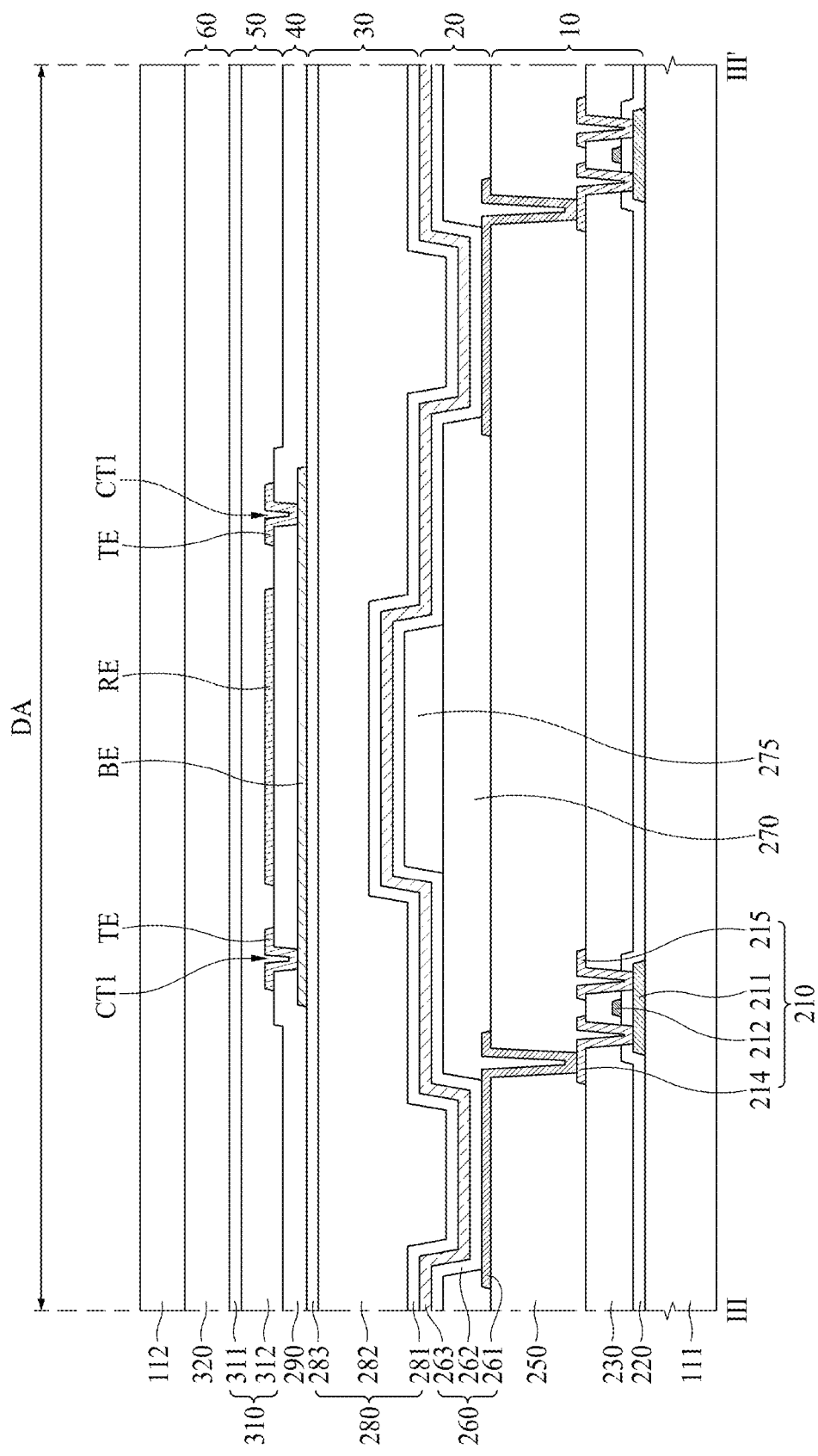
FIG. 11 is a cross-sectional view illustrating a second embodiment taken along line III-III' of FIG. 5.

FIG. 9 is a cross-sectional view illustrating a second embodiment taken along line I-I' of FIG. 4. FIG. 10 is a cross-sectional view illustrating a second embodiment taken along line II-II' of FIG. 4. FIG. 11 is a cross-sectional view illustrating a second embodiment taken along line III-III' of FIG. 5.

A display apparatus with an integrated touch screen according to a second embodiment of the present disclosure may include a first substrate 111, a second substrate 112, a TFT layer 10 between the first and second substrates 111 and 112, a light-emitting device layer 20, a first encapsulation layer 30, a touch sensing layer 40, a second encapsulation layer 50, and an adhesive layer 60. There is a difference in that only the second encapsulation layer 50, and the other elements of the display apparatus with an integrated touch screen illustrated in FIGS. 9 to 11 are substantially similar to those of the display apparatus with an integrated touch screen illustrated in FIGS. 6 to 8. Hereinafter, therefore, detailed descriptions of the first substrate 111, the second substrate 112, the TFT layer 10, the light-emitting device layer 20, the first encapsulation layer 30, the touch sensing layer 40, and the adhesive layer 60 are omitted.

The second encapsulation layer 50 may be on the touch sensing layer 40. The second encapsulation layer 50 may include a second encapsulation film 310.

The second encapsulation film 310 may be on first and second touch electrodes TE and RE. The second encapsulation film 310 may prevent oxygen or water from penetrating into the first and second touch electrodes TE and RE. For example, the second encapsulation film 310 may include a third inorganic layer 311 and an overcoat layer 312. The overcoat layer 312 may be on the first and second touch electrodes TE and RE. The overcoat layer 312 may planarize a step height caused by the first and second touch electrodes TE and RE and bridge electrodes BE. The overcoat layer 312 may be provided in a display area DA, and may be disposed inward with respect to a first dam 121 and a second dam 122.

The third inorganic layer 311 may be on the overcoat layer 312. The third inorganic layer 311 may prevent oxygen or water from penetrating into the first and second touch electrodes TE and RE. The third inorganic layer 311 may be formed, e.g., of silicon nitride, aluminum nitride, zirconium nitride, titanium nitride, hafnium nitride, tantalum nitride, silicon oxide, aluminum oxide, titanium oxide, and/or the like. Embodiments are not limited to these examples.

The third inorganic layer 311 may cover the first dam 121, the second dam 122, and the display area DA. When an organic passivation layer 340 is provided, the third inorganic layer 311 may cover the organic passivation layer 340.

Moreover, the third inorganic layer 311 may not cover first and second touch pads TP and RP. When a bending area BA is provided, the third inorganic layer 311 may not be provided in the bending area BA, e.g., for preventing a crack from occurring when bending is performed.

In the display apparatus with an integrated touch screen according to the second embodiment of the present disclosure, the third inorganic layer 311 may be provided on the overcoat layer 312 that may planarize a step height caused by the first and second touch electrodes TE and RE and the bridge electrodes BE. Accordingly, the third inorganic layer 311 may prevent a seam from being caused by the step height, and may better prevent oxygen or water from penetrating into the first and second touch electrodes TE and RE.

Figure 12:
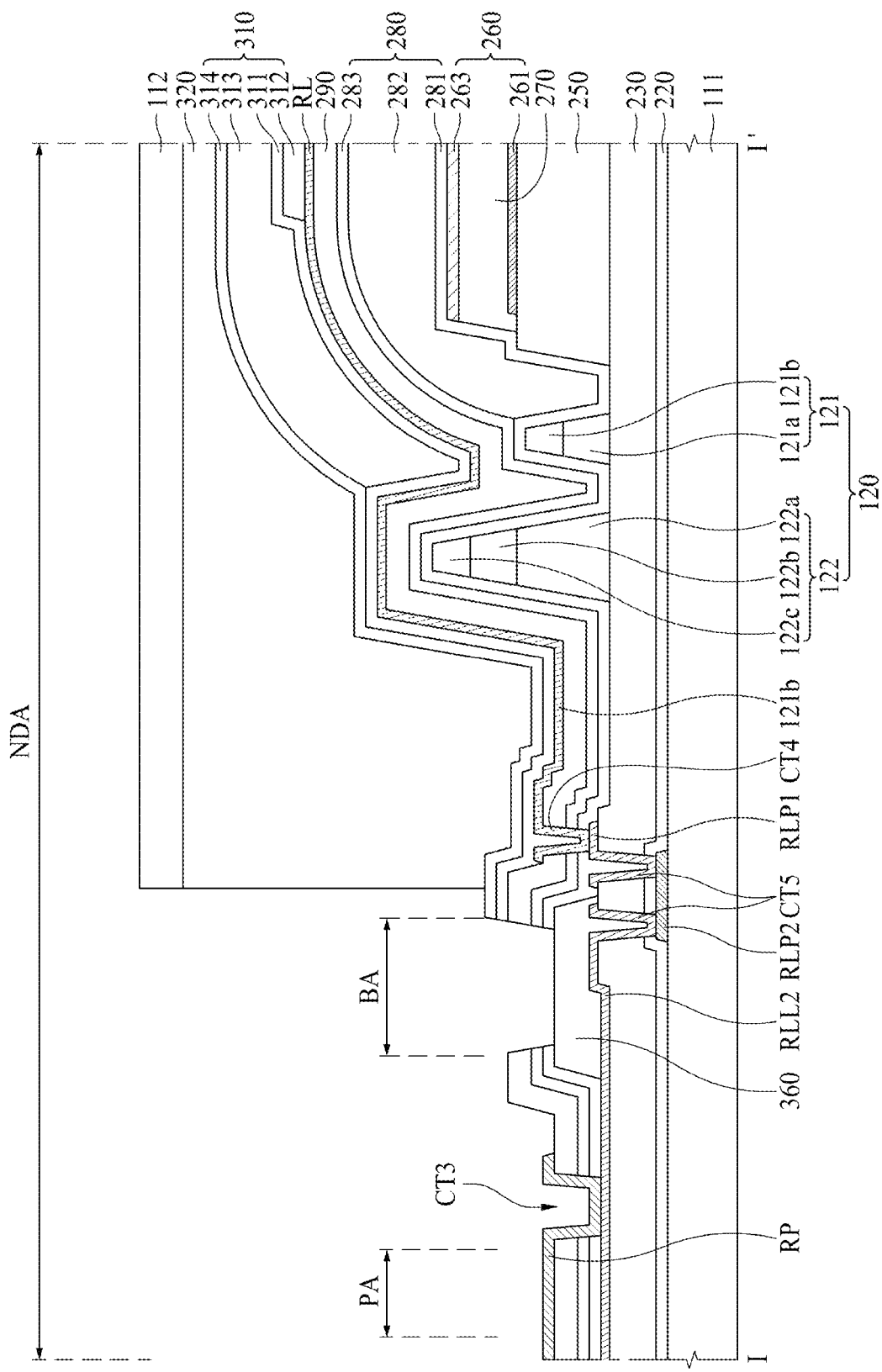
FIG. 12 is a cross-sectional view illustrating a third embodiment taken along line I-I' of FIG. 4.
Figure 13:
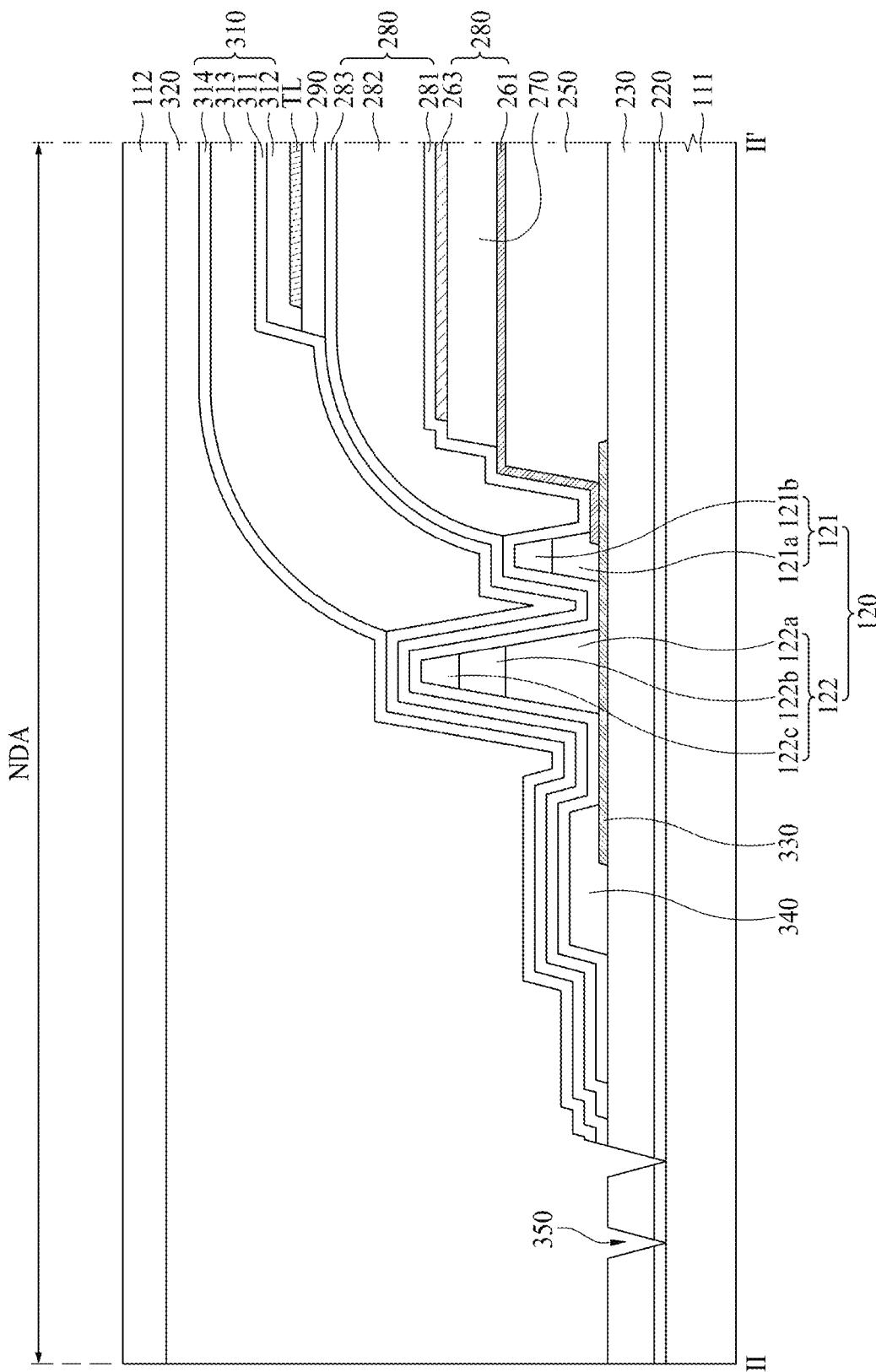
FIG. 13 is a cross-sectional view illustrating a third embodiment taken along line II-II' of FIG. 4.
Figure 14:
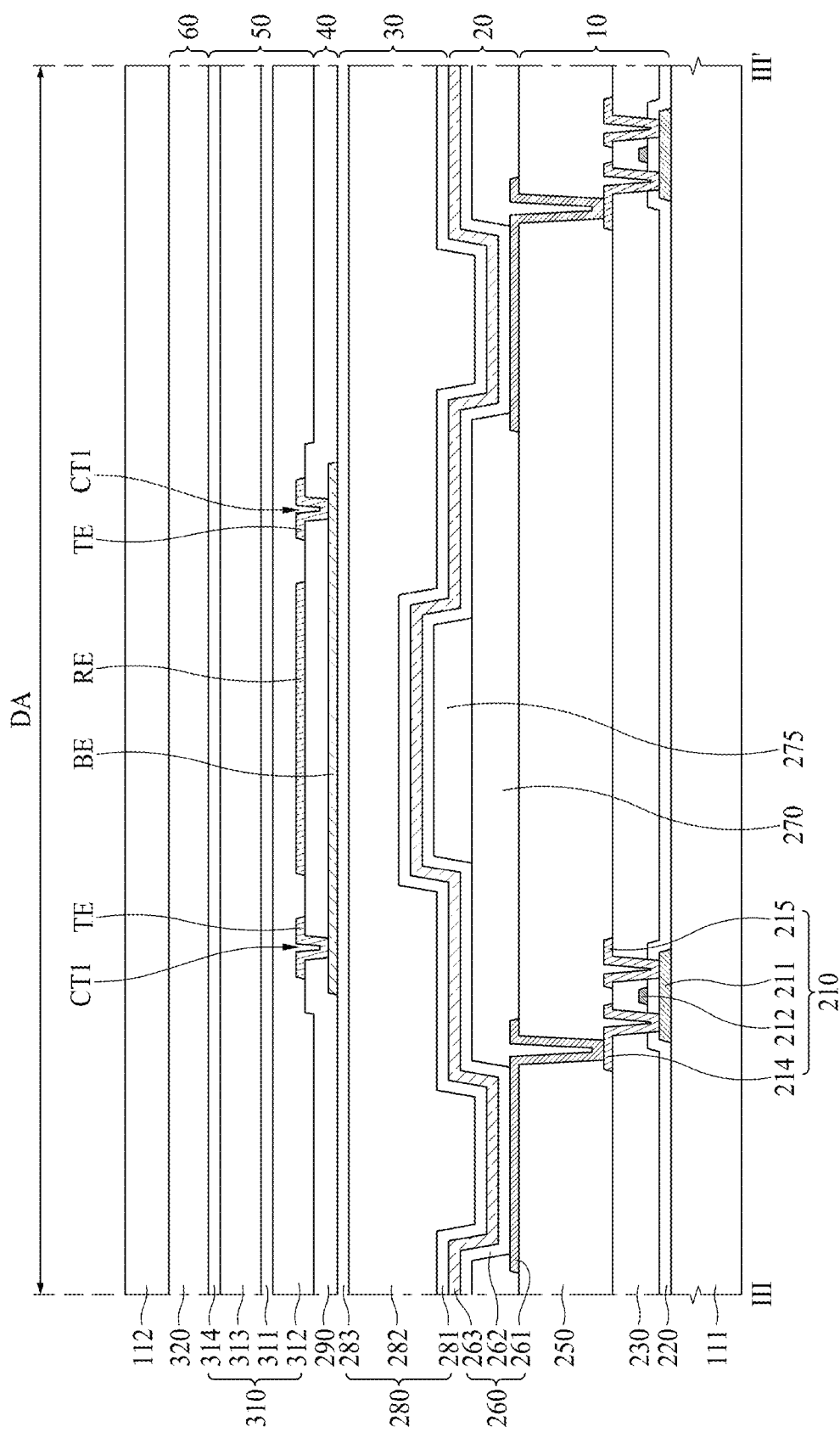
FIG. 14 is a cross-sectional view illustrating a third embodiment taken along line III-III' of FIG. 5.

FIG. 12 is a cross-sectional view illustrating a third embodiment taken along line I-I' of FIG. 4. FIG. 13 is a cross-sectional view illustrating a third embodiment taken along line II-II' of FIG. 4. FIG. 14 is a cross-sectional view illustrating a third embodiment taken along line III-III' of FIG. 5.

A display apparatus with an integrated touch screen according to a third embodiment of the present disclosure may include a first substrate 111, a second substrate 112, a TFT layer 10 between the first and second substrates 111 and 112, a light-emitting device layer 20, a first encapsulation layer 30, a touch sensing layer 40, a second encapsulation layer 50, and an adhesive layer 60. There is a difference in only the second encapsulation layer 50, and the other elements of the display apparatus with an integrated touch screen illustrated in FIGS. 12 to 14 are substantially similar to those of the display apparatus with an integrated touch screen illustrated in FIGS. 6 to 8. Hereinafter, therefore, detailed descriptions of the first substrate 111, the second substrate 112, the TFT layer 10, the light-emitting device layer 20, the first encapsulation layer 30, the touch sensing layer 40, and the adhesive layer 60 are omitted.

The second encapsulation layer 50 may be on the touch sensing layer 40. The second encapsulation layer 50 may include a second encapsulation film 310.

The second encapsulation film 310 may be on first and second touch electrodes TE and RE. The second encapsulation film 310 may include at least one inorganic layer and organic layer, for preventing oxygen or water from penetrating into the first and second touch electrodes TE and RE. For example, the second encapsulation film 310 may include a third inorganic layer 311, an overcoat layer 312, a second organic layer 313, and a fourth inorganic layer 314.

The overcoat layer 312 may be on the first and second touch electrodes TE and RE. The overcoat layer 312 may planarize a step height caused by the first and second touch electrodes TE and RE and bridge electrodes BE. The overcoat layer 312 may be provided in a display area DA, and may be disposed inward with respect to a first dam 121 and a second dam 122.

The third inorganic layer 311 may be on the overcoat layer 312. The third inorganic layer 311 may prevent oxygen or water from penetrating into the first and second touch electrodes TE and RE. The third inorganic layer 311 may be formed, e.g., of silicon nitride, aluminum nitride, zirconium nitride, titanium nitride, hafnium nitride, tantalum nitride, silicon oxide, aluminum oxide, titanium oxide, and/or the like. Embodiments are not limited to these examples.

The third inorganic layer 311 may cover the first dam 121, the second dam 122, and the display area DA. When an organic passivation layer 340 is provided, the third inorganic layer 311 may cover the organic passivation layer 340.

Moreover, the third inorganic layer 311 may not cover first and second touch pads TP and RP. When a bending area BA is provided, the third inorganic layer 311 may not be provided in the bending area BA, e.g., for preventing a crack from occurring when bending is performed.

The second organic layer 313 may be on the third inorganic layer 311. The second organic layer 313 may have a sufficient thickness for preventing particles from penetrating into the first and second touch electrodes TE and RE and the bridge electrodes BE. The second organic layer 313 may be formed, e.g., of an organic layer such as acryl resin, epoxy resin, phenolic resin, polyamide resin, polyimide resin, or the like. Embodiments are not limited to these examples.

The flow of the second organic layer 313 may be blocked by the second dam 122. Thus, the second organic layer 313 may be disposed more inward than the second dam 122. Even when the second organic layer 313 flows out to the second dam 122, the flow of the second organic layer 313 may be blocked by the organic passivation layer 340. Accordingly, according to the present embodiment, the second organic layer 313 may be more effectively prevented from being exposed at the outside of the display apparatus or from penetrating into the first and second touch pads TP and RP.

The fourth inorganic layer 314 may be on the second organic layer 313. The fourth inorganic layer 314 may prevent oxygen or water from penetrating into the first and second touch electrodes TE and RE. The fourth inorganic layer 315 may be formed, e.g., of silicon nitride, aluminum nitride, zirconium nitride, titanium nitride, hafnium nitride, tantalum nitride, silicon oxide, aluminum oxide, titanium oxide, and/or the like. Embodiments are not limited to these examples.

The fourth inorganic layer 314 may cover the second organic layer 313. Also, the fourth inorganic layer 314 may cover the first dam 121, the second dam 122, and the display area DA. When the organic passivation layer 340 is provided, the fourth inorganic layer 314 may cover the organic passivation layer 340.

Moreover, the fourth inorganic layer 314 may not cover first and second touch pads TP and RP. When the bending area BA is provided, the fourth inorganic layer 314 may not be provided in the bending area BA, e.g., for preventing a crack from occurring when bending is performed.

In the display apparatus with an integrated touch screen according to the third embodiment of the present disclosure, the third inorganic layer 311 may be on the overcoat layer 312 that may planarizes a step height caused by the first and second touch electrodes TE and RE and the bridge electrodes BE. Accordingly, the third inorganic layer 311 may prevent a seam from being caused by the step height.

Moreover, in the display apparatus with an integrated touch screen according to the third embodiment of the present disclosure, the third inorganic layer 311, the fourth inorganic layer 314, and the second organic layer 313 between the third inorganic layer 311 and the fourth inorganic layer 314 may be provided. Also, in the display apparatus with an integrated touch screen according to the third embodiment of the present disclosure, oxygen or water may be more effectively prevented from penetrating into the first and second touch electrodes TE and RE. Moreover, in the display apparatus with an integrated touch screen according to the third embodiment of the present disclosure, the flow of the second organic layer 313 may be blocked by the second dam 122, even without a separate dam being additionally provided.

In FIGS. 12 to 14, the second encapsulation film 310 is illustrated as including the overcoat layer 312, but embodiments are not limited thereto. That is, the overcoat layer 312 may be omitted.

As described above, in example embodiments of the present disclosure, the inorganic layer may be provided on the touch sensing layer, thereby preventing oxygen or water from penetrating into the first and second touch electrodes. Moreover, in example embodiments of the present disclosure, the inorganic layer may be attached on the adhesive layer. According to example embodiments of the present disclosure, when an interface adhesive force between the inorganic layer and the adhesive layer is higher than an interface adhesive force between the organic layer and the adhesive layer, interface de-bonding may be reduced or prevented from occurring between the inorganic layer and the adhesive layer.

Moreover, in example embodiments of the present disclosure, the inorganic layer may be provided on the overcoat layer that may planarize a step height caused by the first and second touch electrodes and the bridge electrodes. Accordingly, the inorganic layer may reduce or prevent a seam from being caused by the step height.

Moreover, in example embodiments of the present disclosure, the second encapsulation layer, including two inorganic layers and organic layers, may be provided on the touch sensing layer. Accordingly, in example embodiments of the present disclosure, oxygen or water may be more effectively prevented from penetrating into the first and second touch electrodes. Moreover, in example embodiments of the present disclosure, the flow of the organic layer provided on the touch sensing layer may be blocked by using a conventional dam structure, even without a separate dam being additionally provided.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A display apparatus with an integrated touch screen, the display apparatus comprising:
   a first substrate including a display area and a non-display area surrounding the display area;
   a TFT layer on the first substrate, the TFT layer including a gate electrode, a semiconductor layer, a source electrode, and a drain electrode;
   a first electrode on the TFT layer, the first electrode being electrically connected to the source electrode or the drain electrode;

a light-emitting device layer on the first electrode and disposed in the display area;

a first encapsulation layer on the light-emitting device layer, the first encapsulation layer including a first inorganic layer on the light-emitting device layer, a first organic layer on the first inorganic layer, and a second inorganic layer on the first organic layer;

a touch sensing layer on the second inorganic layer, the touch sensing layer including a first touch electrode, a second touch electrode, a first touch pad provided on the same layer as the first touch electrode, and a second touch pad provided on the same layer as the second touch electrode;

a second encapsulation layer on the touch sensing layer, the second encapsulation layer including a third inorganic layer on the touch sensing layer;

a first dam and a second dam disposed in the non-display area, the first dam disposed between the display area and the second dam;

a first touch line including a first touch connection line; and a second touch line including a second touch connection line, wherein the first inorganic layer contacts the second inorganic layer on the first dam, wherein the first touch connection line is connected to the first touch electrode and the first touch pad, and the second touch connection line is connected to the second touch electrode and the second touch pad, and wherein the first and second touch connection lines are on the same layer as the source electrode and the drain electrode.

2. The display apparatus of claim 1, wherein the first touch line further includes a first touch connection pattern, and wherein the second touch line further includes a second touch connection pattern.

3. The display apparatus of claim 2, wherein the first touch connection pattern is connected to the first touch connection line and is on the same layer as the gate electrode, and wherein the second touch connection pattern is connected to the second touch connection line and is on the same layer as the gate electrode.

4. The display apparatus of claim 1, wherein the first dam is on the first electrode.

5. The display apparatus of claim 1, further including a bank on a planarization layer to divide the first electrode, wherein the first dam comprises a first bottom layer and a first top layer, and wherein the first bottom layer includes a same material as the bank.

6. A display apparatus with an integrated touch screen, the display apparatus comprising:

a first substrate including a display area and a non-display area surrounding the display area;

a light emitting device layer on the first substrate;

a first encapsulation layer on the light emitting device layer, the first encapsulation layer including a first inorganic layer on the light emitting device layer, a first organic layer on the first inorganic layer, and a second inorganic layer on the first organic layer;

a touch sensing layer on the first encapsulation layer;

a second encapsulation layer on the touch sensing layer, the second encapsulation layer including a third inorganic layer on the touch sensing layer; and a dam disposed in the non-display area, the dam being spaced apart from the display area, wherein the third inorganic layer disposed on the touch sensing layer is in contact with the second inorganic layer disposed under the touch sensing layer between the display area and the dam.

7. The display apparatus of claim 6, wherein the touch sensing layer comprises:

a plurality of first touch electrodes arranged in a first direction;

a plurality of second touch electrodes arranged in a second direction intersecting the first direction;

a bridge electrode electrically connecting the plurality of first touch electrodes; and a touch insulation layer disposed between the plurality of first touch electrodes and the bridge electrode and between the plurality of second touch electrodes and the bridge electrode.

8. The display apparatus of claim 7, wherein the third inorganic layer covers the plurality of first touch electrodes and the plurality of second touch electrodes.

9. The display apparatus of claim 7, wherein the second encapsulation layer further includes an overcoat layer disposed between the touch sensing layer and the third inorganic layer.

10. The display apparatus of claim 9, wherein the overcoat layer planarizes a step height caused by the plurality of first touch electrodes, the plurality of second touch electrodes, and bridge electrodes.

11. The display apparatus of claim 7, wherein the touch sensing layer further comprises:

a plurality of first touch pads electrically connected to the plurality of first touch electrodes; and a plurality of second touch pads electrically connected to the plurality of second touch electrodes, wherein the second encapsulation layer does not cover the plurality of first touch pads and the plurality of second touch pads.

12. The display apparatus of claim 7, wherein the first substrate further comprises a bending area, the bending area being bent in the non-display area, and wherein the second encapsulation layer is not provided in the bending area.

13. The display apparatus of claim 6, wherein the second encapsulation layer further includes:

a second organic layer on the third inorganic layer; and a fourth inorganic layer on the second organic layer.

14. The display apparatus of claim 13, wherein the fourth inorganic layer covers the display area and the dam.

15. The display apparatus of claim 13, further comprising:

an organic passivation layer in the non-display area, the organic passivation layer being spaced apart from the dam such that, even when the second organic layer flows over of the dam, an overflow of the second organic layer is blocked by the organic passivation layer.

* * * * *